(12) United States Patent
Tsividis et al.

(10) Patent No.: US 6,861,896 B2
(45) Date of Patent: Mar. 1, 2005

(54) CIRCUITS WITH DYNAMIC BIASING

(75) Inventors: Yannis P. Tsividis, New York, NY (US); Nagendra Krishnapura, Hoboken, NJ (US)

(73) Assignee: The Trustees of Columbia University of the City of New York, New York, NY (US)

( * ) Notice: Subject to any disclaimer, the term of this patent is extended or adjusted under 35 U.S.C. 154(b) by 0 days.

(21) Appl. No.: 10/353,200

(22) Filed: Jan. 28, 2003

(65) Prior Publication Data

US 2003/0117212 A1 Jun. 26, 2003

Related U.S. Application Data

(62) Division of application No. 09/777,831, filed on Feb. 5, 2001, now abandoned.
(60) Provisional application No. 60/180,311, filed on Feb. 4, 2000.

(51) Int. Cl.[7] ................................................ H03B 1/00
(52) U.S. Cl. ........................................................ 327/552
(58) Field of Search ................................. 327/551, 552, 327/553, 555, 556, 557, 558, 559, 560, 561, 562, 563

(56) References Cited

U.S. PATENT DOCUMENTS

| | | |
|---|---|---|
| 5,155,353 A | 10/1992 | Pahr |
| 5,229,721 A | 7/1993 | Stade |
| 5,281,931 A | 1/1994 | Bailey et al. |
| 5,311,143 A | 5/1994 | Soliday |
| 5,414,776 A | 5/1995 | Sims, Jr. |
| 5,467,045 A | 11/1995 | Tanigawa |
| 5,572,163 A | 11/1996 | Kimura |
| 5,757,229 A | 5/1998 | Mitzlaff |
| 5,886,580 A | 3/1999 | Ikeda et al. |
| 5,900,749 A | 5/1999 | Hendrickson et al. |
| 5,929,699 A | 7/1999 | Lewicki |
| 5,930,374 A | 7/1999 | Werrbach et al. |
| 5,942,935 A | 8/1999 | Okanobu |
| 6,011,418 A | 1/2000 | Siniscalchi |
| 6,208,199 B1 | 3/2001 | Andersson |
| 6,292,501 B1 | 9/2001 | Dubuse |

OTHER PUBLICATIONS

D.R. Frey, "Log–domain filtering: An Approach to Current Mode Filtering," *IEE Proc. G 1993*, vol. 140, No. 6, pp. 406–416, Dec. 1993.
D.R. Frey and Y.P.P. Tsividis, "Syllabically companding log domain filter using dynamic biasing," *Electronics Letters*, vol. 33, No. 18, pp. 1506–1507, Aug. 28, 1997.
Y. Tsividis, "Externally Linear Time–Invariant Systems and their Applications to Companding Signal Processors," *IEEE TCAS–II*, vol. 44, No. 2, pp. 65–85, Feb. 1997.
J. Mulder, W.A. Serdijn, A.C. van der Woerd and A.H.M. van Roermund, "A syllabic companding translinear filter," *Proc. 1997 ISCAS*, vol. 1, pp. 101–104, Hong Kong, 1997.
E. M. Blumenkrantz, "The Analog Floating Point Technique," *Proc. 1995 IEEE Symp. on Low Power Electronics*, San Jose, CA, Oct. 1995, pp. 72–73.
M. Punzenberger and C. Enz. "A 1.2–V Low Power BiCMOS Class AB Log–Domain Filter," *IEEE Journa of Solid State Circuits*, vol. 32, pp. 1968–1978, Dec. 1997.
J. Mulder, A.C. van der Woerd, W. A. Serdijn and A.H.M. van Roermund, "Current–Mode Companding √x—Domain Integrator," Electronics Letters, vol. 32, No. 3, pp. 198–199, Feb. 1, 1996.

(List continued on next page.)

*Primary Examiner*—Jeffrey Zweizig
(74) *Attorney, Agent, or Firm*—Baker Botts LLP

(57) ABSTRACT

Techniques are provided for the implementation of dynamically biased circuits. In these circuits, bias currents are varied according to signal amplitude. Benefits include reduced power dissipation, reduced noise, and increased dynamic range. The techniques can be employed in various types of circuits such as, for example, amplifiers, log-domain circuits, and filters.

16 Claims, 17 Drawing Sheets

OTHER PUBLICATIONS

R. W. Adams, "Filtering in the Log Domain," Preprint 1470, presented at 63rd Audio Eng. Soc. Conf., NY, May 1997.

N. Krishnapura, Y. Tsividis, and D. R. Frey, "Simplified technique for syllabic companding in log–domain filters," *Electronics Letters*, vol. 36, No. 15, pp. 1257–1259, Jul. 20, 2000.

Y.P. Tsividis, V. Gopinathan, and L. Tóth, "Companding in signal processing," *Electronics Letters*, vol. 26 pp. 1331–1332, Aug. 1990.

Y.P. Tsividis, "General approach to signal processors employing companding," *Electronics Letters*, vol. 31 No. 18, pp. 1549–1550, Aug. 1995.

Y. Tsividis, D. Li, "Current–Mode Filters Using Syllabic Companding," *IEEE International Symposium of Circuits and Systems*, Atlanta, vol. 1, pp. 121–124, May 12–15, 1996.

Y.P. Tsividis, "Minimising power dissipation in analogue signal processors through syllabic companding," *Electronics Letters*, vol. 35, No. 21., pp. 1805–1807, Oct. 14, 1999.

Adel A.M. Saleh and Donald C. Cox, "Improving the Power–Added Efficiency of FET Amplifiers Operatinf with Varying–Envelope Signals," *IEEE Trans. Microwave Theory and Techniques*, vol. 31, No. 1 pp. 51–56, Jan. 1983.

K. Yang et al., "High Efficiency Class–A Power Amplifiers with a Dual–Bias–Control Scheme," *IEEE Trans. Microwave Theory and Techniques*, vol. 47, No. 8, pp. 1426–1432, Aug. 1999.

G. Hanington et al., "High Efficiency Power Amplifier Using Dynamic Power–Supply Voltage for CDMA Applications," *IEEE Trans. Microwave Theory and Techniques*, vol. 47, No. 8, pp. 1471–1476, Aug. 1999.

D. Frey, Y. Tsividis, G. Efthivoulidis, and N. Krishnapura, "Syllabic companding log–domain filters", *IEEE Transactions on Circuits and Systems*, Part II, vol. 48, No. 4, pp. 329–339, Apr. 2001.

N. Krishnapura and Y. Tsividis, "Dynamically biased 1 MHz low–pass filter with 61 dB peak SNR and 112 dB input range", Digest, 2001 *IEEE International Solid–State Circuits Conference*, pp. 360, 361, and 465, San Francisco, Feb. 2001.

E. A. Vittoz and Y. Tsividis, "Frequency—Dynamic Range—Power", Chapter 10 in *Trade–offs in Analog Circuit Design*, ed. by C. Toumazou and G. Moschytz, Kluwer Academic Publishers, Boston, 2002.

Y. Tsividis, N. Krishnapura, Y. Palaskas, and L. Toth, "Internally varying circuits minimize power dissipation", *IEEE Circuits and Devices Magazine*, vol. 19, pp. 63–72, Jan. 2003.

N. Krishnapura and Y. Tsividis, "Noise and power reduction in filters through the use of adjustable biasing", *IEEE Journal of Solid–State Circuits*, vol. 36, No. 12, pp. 1912–1920, Dec. 2001.

P. R. Gray and R. G. Meyer, "Future directions in silicon ICs for RF personal communications", Proc. 199 *IEEE Custom Integrated Circuit Conference*, pp. 83–90, May 1995.

F. Behbahani, A. Karimi–Sanjaani, W.–G. Tan. A. Roithmeier, J. C. Leete, K. Hoshino, and A. A. Abidi, "Adaptive analog IF signal processor for a wide–band CMOS wireless receiver", *IEEE Journal of Solid–State Circuits*, vol. 36, NO. 8, Aug. 2001.

CIRCUITS WITH DYNAMIC BIASING

CROSS-REFERENCE TO RELATED APPLICATION

This application is a divisional of U.S. patent application Ser. No. 09/777,831, entitled "Circuits with Dynamic Biasing," which was filed on Feb. 5, 2000 abandoned which claims benefit of Ser. No. 60/180,311 filed on Feb. 4, 2000.

BACKGROUND OF THE INVENTION

In order to conserve energy in electronic circuits, particularly in battery-operated electronics, it is preferable to use bias currents which are no larger than necessary. Therefore, because the minimum required bias current tends to depend on signal amplitude, it is often desirable to use actual bias currents which are dependent on the amplitude of the signal. An additional advantage of amplitude-dependent biasing is that, if the bias current is only as large as needed, it will produce the least possible amount of noise (e.g., shot noise). These advantages have been discussed in the electronics literature with respect to at least one specific log-domain circuit. D. R. Frey and Y. P. Tsividis, "Syllabically Companding Log Domain Filter Using Dynamic Biasing," Electronics Letters, vol. 33, no. 5, Aug. 28, 1997. Amplitude-dependent biasing can used in other circuits, e.g., amplifiers. However, one potential problem is that the bias can, in some cases, interact with the signal. Accordingly, there is a need for circuits in which the bias control and the signal properties are "orthogonal"—i.e., do not interact with each other.

SUMMARY OF THE INVENTION

It is therefore an object of the invention to provide a circuit which can accommodate signals of various amplitudes in an energy-efficient manner.

It is a further object of the invention to provide a circuit which can accommodate signals of various amplitudes while maintaining a high signal-to-noise ratio.

It is yet another object of the invention to provide a circuit which can accommodate signals of various amplitudes while avoiding excessive interaction between the bias control and the signal.

These and other objects are accomplished by a circuit having a bias which can be adjusted according to a signal which is received, generated, or transmitted by the circuit.

In accordance with one aspect of the invention, a signal is processed using an apparatus comprising: (1) a selected one of a class-AB circuit and a class-B circuit, the selected one having at least one input and at least one bias, the at least one input being adapted to receive at least one input signal, and the selected one being configured to process the at least one input signal to thereby generate at least one output signal related to the at least one input signal by an input-output characteristic having a crossover region which exhibits distortion; and (2) an amplitude detector configured to perform the operations of: (a) receiving the at least one input signal; (b) detecting at least one amplitude of the at least one input signal, and (c) dynamically adjusting the at least one bias in accordance with the at least one amplitude, wherein the at least one bias controls a level of the at least one output signal such that the at least one output signal avoids the crossover region.

In accordance with another aspect of the invention, a signal is processed using a filter having at least one input and at least one bias, wherein the at least one input comprises: (1) a first input for receiving a first input signal; and (2) a second input for receiving a second input signal, wherein the filter is configured to perform the steps of: (a) applying a first filtering operation to the first input signal, thereby generating a first output signal which is communicated to at least one output of the filter, the first filtering operation having a first frequency characteristic in which low frequencies are suppressed, and (b) applying a second filtering operation to the second input signal, the second input signal controlling the at least one bias, the second filtering operation having a second frequency characteristic in which low frequencies are passed, and the second input signal being adjusted in accordance with an amplitude of the first input signal.

In accordance with an additional aspect of the invention, a signal is processed using a filter having at least one input and first and second biases, wherein the at least one input comprises first and second inputs, the first input being adapted to receive a first input signal and a first bias signal related to an amplitude of at least one of the first and second input signals, the first bias signal being for controlling the first bias, the second input being adapted to receive a second input signal and a second bias signal, the second bias signal being for controlling the second bias, the second bias signal being approximately equal to the first bias signal, and the filter being configured to filter a difference of first and second input signals, thereby generating a filter output signal.

In accordance with another aspect of the invention, a signal is processed using a combined filter comprising: (1) a first filter having a first filter configuration, a first bias input for receiving a first bias, a first input for receiving a first input signal, and a first output for providing a first output signal; (2) a second filter having a second filter configuration, a second bias input for receiving a second bias, a second input for receiving a second input signal, and a second output for providing a second output signal, the second filter configuration matching the first filter configuration, the first bias and the second bias being adjusted in accordance with at least one amplitude of at least one of the first input signal and the second input signal, and the first bias and the second bias being adjusted to be approximately equal; and (3) a combined filter output configured to provide a combined output signal comprising a difference of the first output signal and the second output signal.

In accordance with yet another aspect of the invention, a signal is processed using an apparatus comprising: (1) a first transistor, comprising a first signal-receiving terminal, a first current-carrying terminal adapted to be connected to a voltage source, and a second current-carrying terminal connected to the first signal-receiving terminal; (2) a second transistor, comprising: a second signal-receiving terminal connected to the first signal-receiving terminal, a third current-carrying terminal adapted to be connected to the voltage source, and a fourth current-carrying terminal; (3) a first adjustable current source in communication with the second current-carrying terminal and allowing a first bias current to flow through the second current-carrying terminal; (4) a second adjustable current source in communication with the fourth current-carrying terminal and allowing a second bias current to flow through the fourth current-carrying terminal, the second bias current being approximately equal to the first bias current, and the first and second adjustable current sources being adjusted in accordance with an amplitude of a first input signal coupled into at least one of the second current-carrying terminal and the fourth current-carrying terminal; and (5) an output connected to the fourth current-carrying terminal.

In accordance with an additional aspect of the invention, a signal is processed using an apparatus comprising: (1) a dynamically biased signal-processing circuit having an input and an output; and (2) a feedback path providing a feedback signal from the output to the input.

In accordance with a further aspect of the invention, a signal size is detected by a detector comprising: (1) a differencing block configured to perform the operations of: (a) receiving a first input signal, (b) receiving a second input signal, and (c) generating a difference signal comprising a difference of the first and second input signals; (2) an exponentiator configured to exponentiate a signal comprising the difference signal, thereby generating an exponentiated signal, wherein an output signal of the detector comprises the exponentiated signal; and (3) a filter configured to perform low-pass filtering of a signal comprising the difference signal, thereby generating a filtered signal, wherein the output signal further comprises the filtered signal, and wherein the second input signal comprises the output signal.

In accordance with yet another aspect of the invention, a signal size is detected by a detector comprising: (1) first, second, third, fourth, and fifth nodes, wherein an input signal is received by the first node; (2) a first transistor, comprising: (a) a first signal-receiving terminal connected to the second node, (b) a first current-carrying terminal connected to the third node, and (c) a second current-carrying terminal adapted to receive a first bias current; (3) a second transistor, comprising: (a) a second signal-receiving terminal connected to the fourth node, (b) a third current-carrying terminal connected to the third node, and (c) a fourth current-carrying terminal adapted to receive a second bias current, the fourth current-carrying terminal being connected to the fourth node; (4) a high-frequency shunt connected between the fourth node and a first voltage node, the first voltage node being adapted to be connected to a first voltage source; (5) a third transistor, comprising: (a) a third signal-receiving terminal connected to the fourth node, (b) a fifth current-carrying terminal connected to the fifth node, and (c) a sixth current-carrying terminal adapted to receive a third bias current; and (6) a fourth transistor, comprising: (a) a fourth signal-receiving terminal adapted to be connected to a second voltage source, (b) a seventh current-carrying terminal connected to the fifth node, and (c) an eighth current-carrying terminal connected to the first node.

BRIEF DESCRIPTION OF THE DRAWINGS

Further objects, features, and advantages of the invention will become apparent from the following detailed description taken in conjunction with the accompanying figures showing illustrative embodiments of the invention, in which:

FIG. 15b is a block diagram illustrating a companding low-pass filter having input-output characteristics similar to those of the filter of FIG. 15a;

Figure 1:
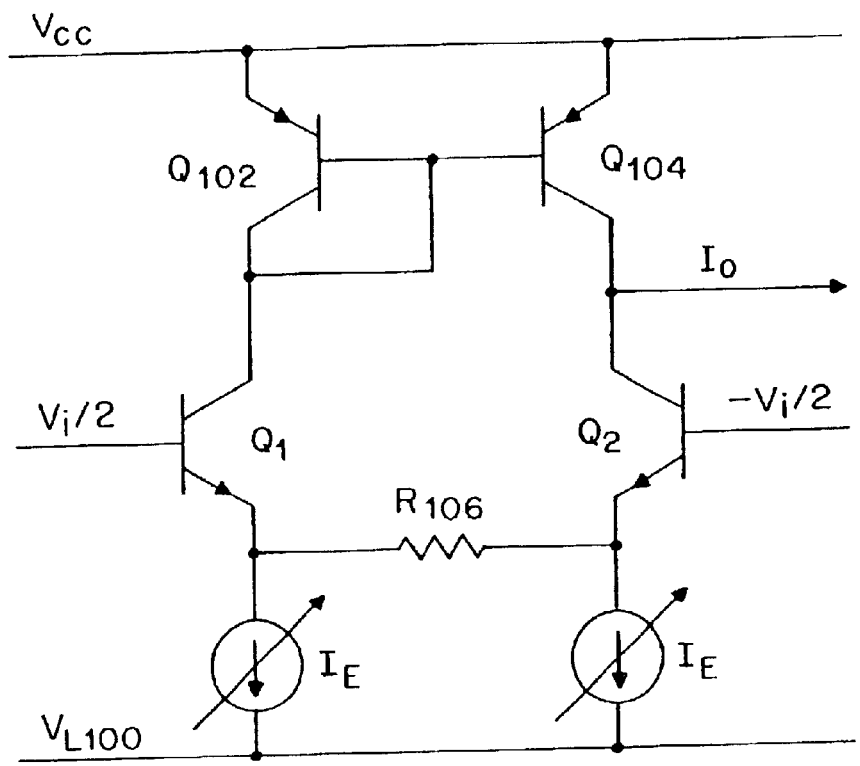
FIG. 1 is a schematic diagram illustrating a transconductor having dynamic biasing in accordance with the invention.

Throughout the figures, unless otherwise stated, the same reference numerals and characters are used to denote like features, elements, components, or portions of the illustrated embodiments. Moreover, while the subject invention will now be described in detail with reference to the figures, and in connection with the illustrative embodiments, changes and modifications can be made to the described embodiments without departing from the true scope and spirit of the subject invention as defined by the appended claims.

DETAILED DESCRIPTION OF THE INVENTION

FIG. 1 illustrates an example of a transconductor circuit which is dynamically biased in accordance with the invention. The circuit of FIG. 1 is powered by voltage sources $V_{CC}$ and $V_{L100}$. It is to be noted that voltage (i.e., electrical potential) is inherently relative, and accordingly, the term "voltage source," as used herein, is defined to include ground (i.e., a voltage source producing a voltage of zero). In particular, in the circuit of FIG. 1, either of $V_{CC}$ and $V_{L100}$ can be a connection to ground. The same is true for at least one voltage source in each of the circuits disclosed herein.

In the circuit of FIG. 1, transistors $Q_{102}$ and $Q_{104}$ form a current mirror which sends current through transistors $Q_1$ and $Q_2$, respectively. The emitters of transistors $Q_1$ and $Q_2$ are connected by a resistor $R_{106}$. Each of transistors $Q_1$ and $Q_2$ is biased with a bias current $I_E$ which flows through its current-carrying terminals—specifically its emitter and collector. The transconductor of FIG. 1 is operated in a differential mode in which the input voltage $V_i$ is applied across the respective signal-receiving terminals (i.e., the base terminals) of the transistors $Q_1$ and $Q_2$. The transconductor produces an output current $I_O$.

If the transconductance of the bipolar transistors is much larger than $1/R_{106}$, the transconductance of the stage, $I_o/V_i$, becomes approximately equal to $1/R_{106}$, independently of $I_E$. Accordingly, $I_E$ can be set at the minimum value required for a given signal. Specifically, a high value of $I_E$ can be used for large signals, and a low value of $I_E$ can be used for small signals.

In order to establish the most suitable bias of a signal processing circuit—such as, for example, a transconductor, an amplifier, or a filter—it can be desirable to base the bias upon a signal representing the amplitude or envelope of the signal being processed. The amplitude or envelope signal can be received from an external source, or can be generated using an envelope detector. A low-pass-filtered rectifier, well-known for use in many other applications, is one example of a circuit which can be used as an envelope detector.

It is to be noted that the circuit of FIG. 1 can also be reconfigured to have a topology in which the current sources $I_E$ are connected to $V_{CC}$, the current mirror is connected to $V_{L100}$, the NPN transistors are replaced with PNP transistors, and the PNP transistors are replaced with NPN transistors.

Figure 2:
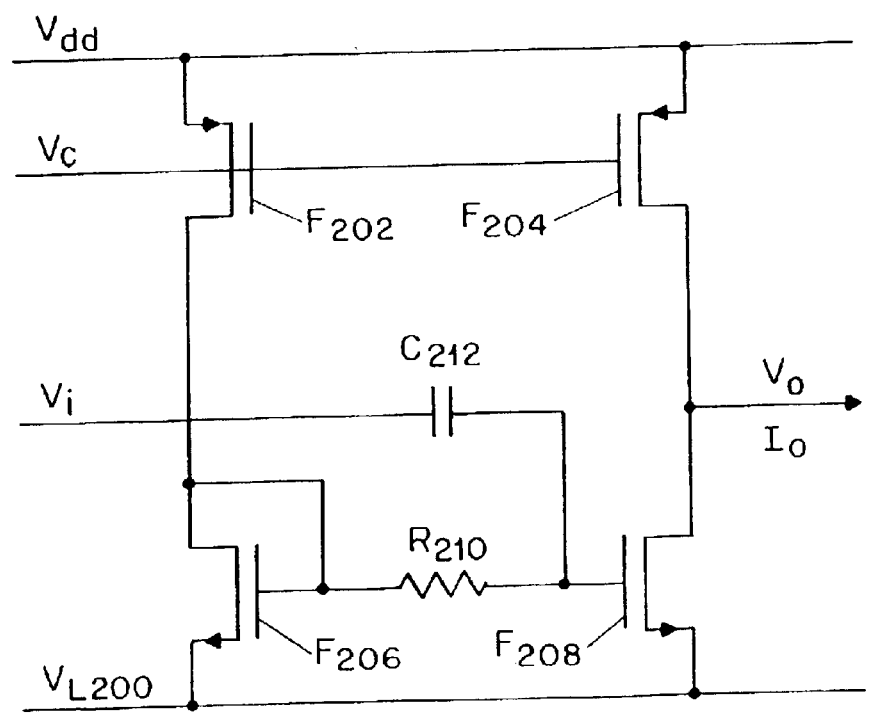
FIG. 2 is a schematic diagram illustrating an amplifier output stage having dynamic biasing in accordance with the invention.

The technique of the invention can also be employed in the output stage of an amplifier, an example of which is illustrated in FIG. 2. The output stage of FIG. 2 is powered by two voltage sources $V_{DD}$ and $V_{L200}$. The circuit includes p-channel field effect transistors ("FETs") $F_{202}$ and $F_{204}$ which serve as current sources and are controlled by a bias voltage $V_C$. The bias voltage $V_C$ is applied to the signal-receiving terminal—in this case, the gate—of each of p-channel transistors $F_{202}$ and $F_{204}$. The bias currents flowing through the current-carrying terminals—in this case, the sources and drains—of p-channel FETs $F_{202}$ and $F_{204}$ are fed into respective drain terminals of n-channel FETs $F_{206}$ and $F_{208}$. The gates of n-channel transistors $F_{206}$ and $F_{208}$ are connected by a resistor $R_{210}$. The gate and drain of FET $F_{206}$ are connected together. An input voltage $V_i$ is coupled to the gate of n-channel FET $F_{208}$ through a capacitor $C_{212}$. An output voltage $V_o$ and an output current $I_o$ are generated at the connected drains of n-channel transistor $F_{208}$ and p-channel transistor $F_{204}$. In accordance with the invention, the bias voltage $V_c$ can be adjusted according to the input signal, such that $F_{202}$ and $F_{204}$ produce higher bias currents for larger signals and lower bias currents for smaller signals.

One method of feeding a signal into a circuit is through alternating current ("AC") coupling—for example, through a capacitor, as illustrated in FIG. 2. However, other techniques can also be used. In the circuit of FIG. 2, the transconductance of the stage will depend on the bias current. If there is high gain in front of this stage, and the entire circuit is operated in a closed-loop (i.e., feedback) mode, such bias-dependent transconductance need not have a large effect on the transfer function of the entire circuit. In addition, the stage can be reconfigured by using p-channel FETs in the circuit mirror and n-channel FETs to control the bias current; in such a reconfigured circuit, the sources of the p-channel FETs of the current mirror would be connected to $V_{dd}$, and the sources of the n-channel biasing FETs would be connected to $V_{L200}$.

Figure 3:
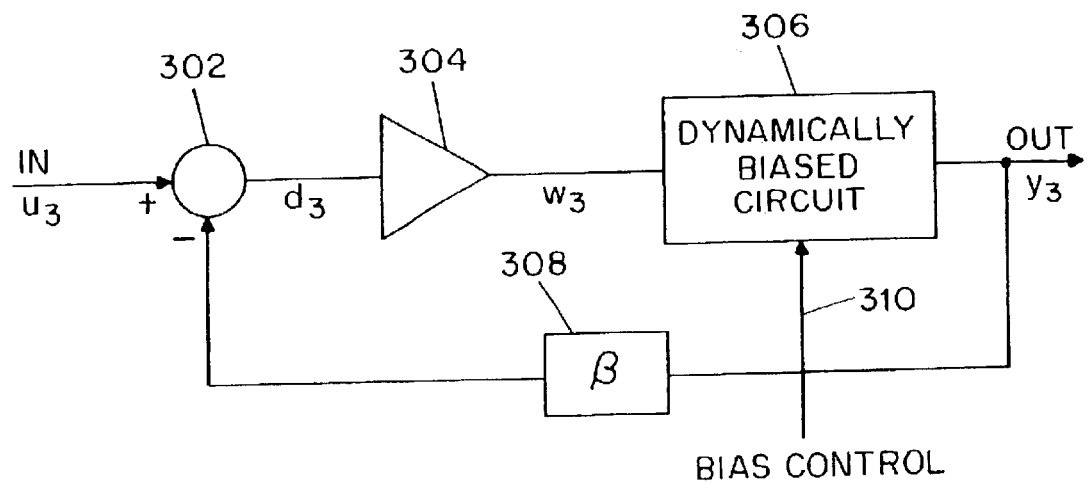
FIG. 3 is a block diagram illustrating a feedback amplifier having a dynamically biased output stage in accordance with the invention.

In accordance with the invention, dynamically biased circuits can be designed as shown in FIG. 3. In the circuit of FIG. 3, an input signal $u_3$ passes through the positive input of a differencing block 302, from which the difference signal $d_3$ passes to a gain stage 304 where it is amplified to produce an amplified signal $w_3$. In this example, the gain stage 304 is assumed to have a very large gain—ideally ∞. The amplified signal $w_3$ enters a dynamically biased circuit 306 which generates an output signal $y_3$. The bias of the dynamically biased circuit 306 is controlled by a bias control 310. A feedback path 308 connects the output of the dynamically biased circuit 306 to the negative input of the differencing block 302. The difference signal $d_3$ seen by the gain stage is $u_3-\beta y_3$, where $\beta$ is the feedback factor ($\beta<1$ for an amplifier). In the steady state of the feedback loop, the difference signal $d_3=u_3-\beta y_3$ is 0. This implies that the output attains a value $y_3=u_3/\beta$. It is to be noted that the value of $y_3$ is independent of any quantity other than the input $u_3$. Therefore, it can be seen that the bias of the dynamically biased circuit has no effect on the output. As a result, disturbances due to bias changes are reduced due to the application of feedback.

In particular, when the bias of the dynamically biased circuit 306 is changed, the output tends to change. However, the changed output $y_3$, through the negative feedback loop 308 and the gain stage 304, causes a change in the input $w_3$ of the dynamically biased circuit 306 in such a manner as to counteract the influence of the bias 310 and restore the output $y_3$ to its original value. An advantage of the circuit of FIG. 3, as compared to a class-B circuit, is that the circuit of FIG. 3 produces no crossover distortion.

Figure 4:
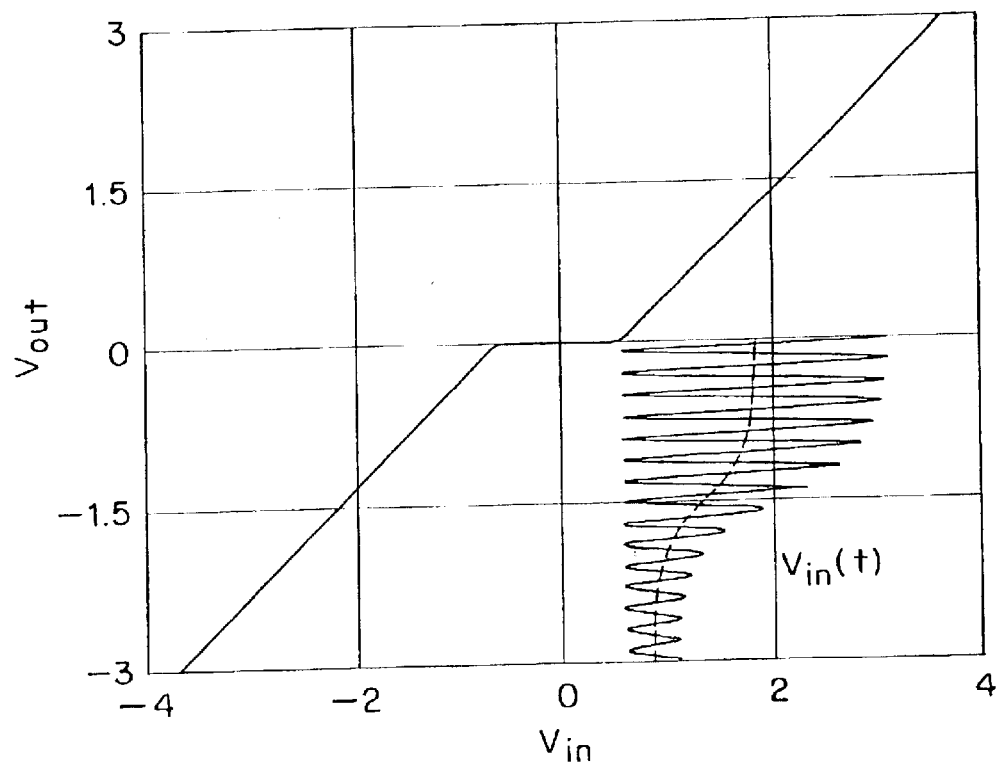
FIG. 4 is a voltage graph illustrating the use of dynamic biasing to avoid crossover distortion in a circuit in accordance with the invention.

There are several ways in which one may configure dynamically biased circuit topologies. For example, a low-pass class B or class AB circuit can be dynamically biased to avoid the crossover region, where large distortion usually occurs. An exemplary voltage characteristic of such a circuit is illustrated in FIG. 4. In this example, the average value of the input signal $V_{in}$ is varied, so that $V_{in}(t)$ always stays clear of the high-distortion region of the voltage characteristic. By this technique, the bias is controlled to be sufficient to preserve the linearity of the circuit, but otherwise to be as small as possible so that low power dissipation—and in some circuits, low noise—is achieved.

Figure 5:
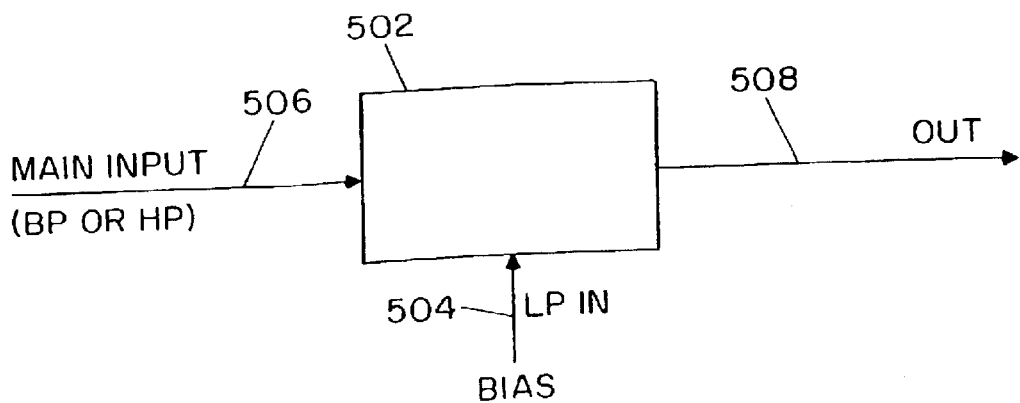
FIG. 5 is a block diagram illustrating the use of dynamic biasing applied to a low-pass input of a circuit in accordance with the invention.
Figure 6:
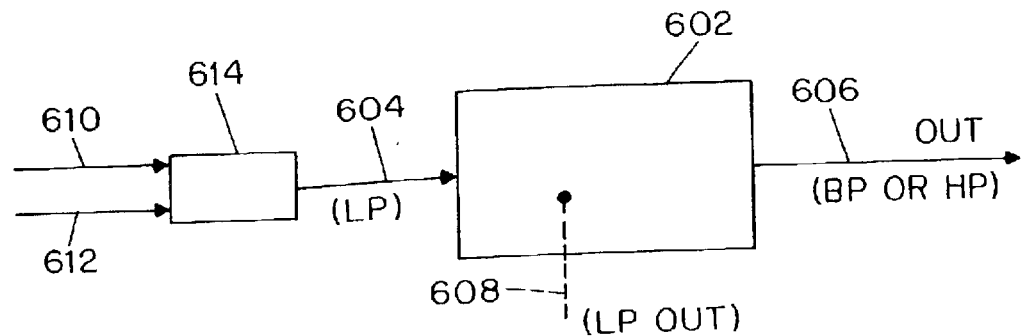
FIG. 6 is a block diagram illustrating the use of dynamic biasing applied to the input of a circuit having an internal low-pass node in accordance with the invention.

Additional examples of circuits in accordance with the invention are illustrated in FIGS. 5 and 6. The circuit 502 of FIG. 5, which can be, for example, a filter or an amplifier, is not a low-pass circuit. Therefore, because the bias tends to be slowly varying, it can be beneficial to apply the bias to a separate, low-pass input 504, and to apply the signal being processed to the main input 506, as shown in FIG. 5. The circuit generates an output signal 508.

Figure 17A:
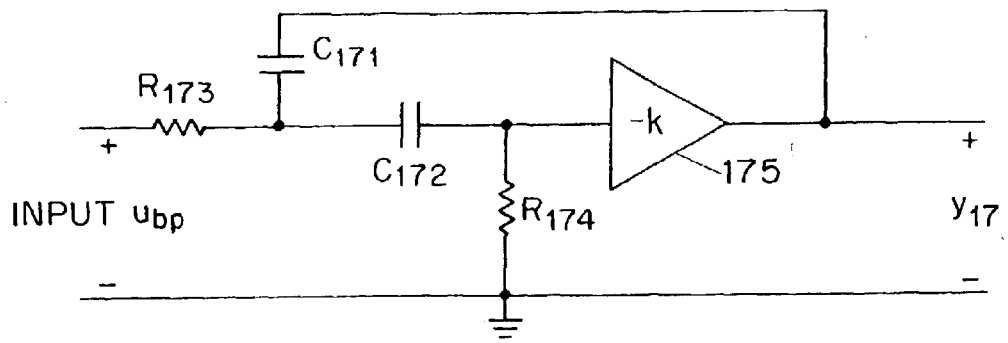
FIG. 17a is a schematic diagram illustrating a band-pass filter.
Figure 17B:
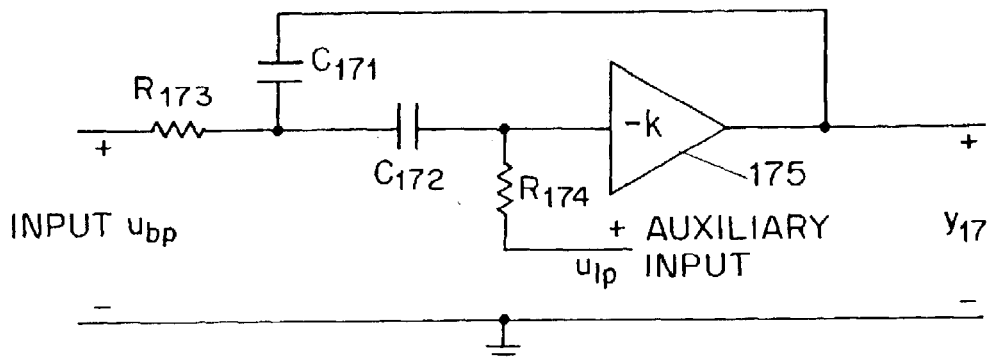
FIG. 17b is a schematic diagram illustrating a band-pass filter having an auxiliary input for the introduction of dynamic bias in accordance with the invention.

FIGS. 17a and 17b illustrate an example of a type of filter, in this case a band-pass filter, which can be dynamically biased using a low-pass input in accordance with the invention. FIG. 17a illustrates an exemplary band-pass filter having an input $u_{bp}$ and an output $y_{17}$. The filter includes two resistors $R_{173}$ and $R_{174}$ and a capacitor $C_{172}$ which serve as an input network. The filter also includes an amplifier 175 with a gain of −k, where k is a positive number—e.g., a positive integer. Feedback is provided by a feedback capacitor $C_{171}$.

Figure 24:
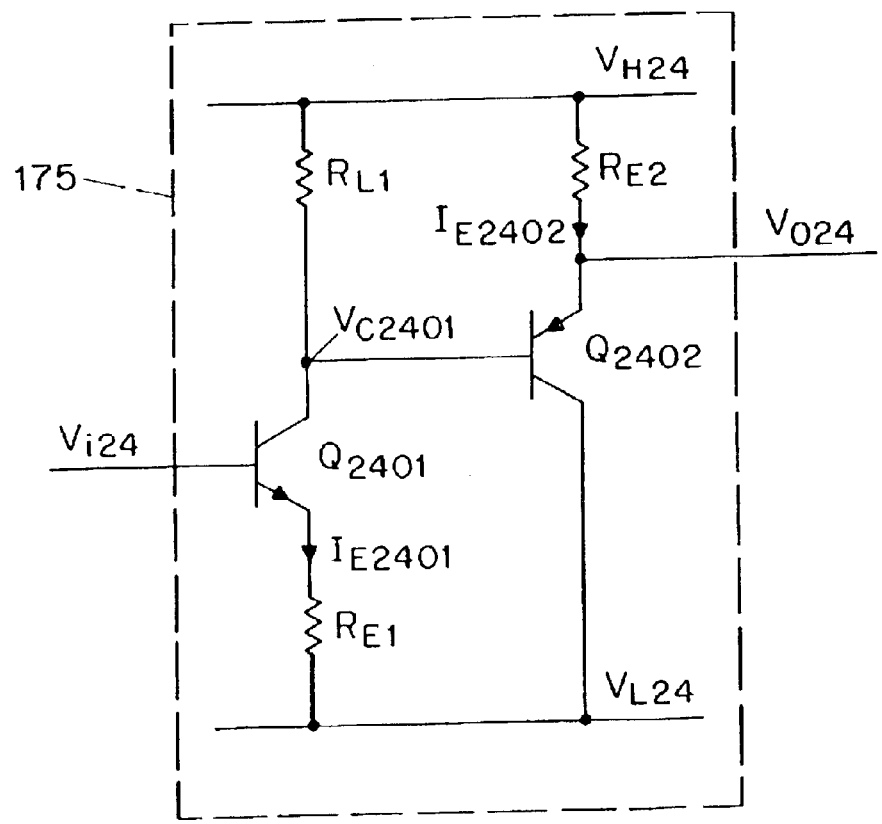
FIG. 24 is a schematic diagram illustrating an amplifier in accordance with the invention.

FIG. 24 illustrates an example of an amplifier which can be used as the amplifier 175 in the circuit of FIG. 17. The exemplary amplifier 175 includes transistors $Q_{2401}$, and $Q_{2402}$ and resistors $R_{L1}$, $R_{E1}$, and $R_{E2}$. The signal-receiving terminal (i.e., the base) of $Q_{2401}$ receives an input voltage $V_{i24}$. The transistor $Q_{2401}$ has current-carrying terminals—a collector and an emitter. The collector of $Q_{2401}$ is connected to the signal-receiving terminal (i.e., the base) of transistor $Q_{2402}$, and is also connected to a voltage source $V_{H24}$ through a resistor $R_{L1}$. The emitter of $Q_{2401}$ is connected to another voltage source $V_{L24}$ through an additional resistor $R_{E1}$. In the specific example illustrated in FIG. 24, $V_{H24}$ has a higher voltage than $V_{L24}$. $Q_{2401}$, $R_{L1}$, and $R_{E1}$ form an emitter degenerated amplifier stage having a gain of −k, where $k=R_{L1}/R_{E1}$. The output voltage of this stage is the collector voltage $V_{C2401}$ of $Q_{2401}$.

In the illustrated amplifier 175, transistor $Q_{2402}$ and resistor $R_{E2}$ form an emitter follower stage having a gain of 1. The base of $Q_{2402}$ receives the amplified voltage $V_{C2401}$ from the collector of $Q_{2401}$. The collector of $Q_{2402}$ is connected to voltage source $V_{L24}$. The emitter of $Q_{2402}$ is connected to voltage source $V_{H24}$ through resistor $R_{E2}$. The output voltage $V_{O24}$ of the emitter follower—which is also the output voltage of the entire amplifier 175—is the voltage at the collector of $Q_{2402}$.

The gain −k of the amplifier 175 does not strongly depend on the bias currents $I_{E2401}$ and $I_{E2402}$ flowing through $Q_{2401}$ and $Q_{2402}$, respectively. However, the bias currents $I_{E2401}$ and $I_{E2402}$ affect the size of the input voltage $V_{i24}$ that can be accommodated by the amplifier 175. Furthermore, a direct current ("DC") voltage component $V_{inDC}$ of the input voltage $V_{i24}$ can affect the bias currents $I_{E2401}$ and $I_{E2402}$, as is demonstrated below.

The bias current $I_{E2401}$ flowing the $Q_{2401}$ is:

$I_{E2401}=(V_{inDC}-V_{be24})/R_{E1}$, where $V_{be24}$ is the base-emitter voltage of the transistors $Q_{2401}$ and $Q_{2402}$. The bias current $I_{E2402}$ flowing through $Q_{2402}$ is:

$I_{E2402}=[(V_{inDC}-V_{be24})R_{L1}/R_{E1}-V_{be24}]/R_{E2}$.

It can thus be seen that the bias currents $I_{E2401}$ and $I_{E2402}$ of the amplifier 175 can be controlled by adjusting the DC component $V_{inDC}$ of the input voltage $V_{i24}$ received by the amplifier 175. For example, $V_{inDC}$ can be reduced if the AC amplitude of $V_{i24}$ is small, thereby reducing the bias currents $I_{E2401}$ and $I_{E2402}$. Because of the reduced bias currents $I_{E2401}$ and $I_{E2402}$, the amplifier 175 has reduced power consumption.

Figure 18:
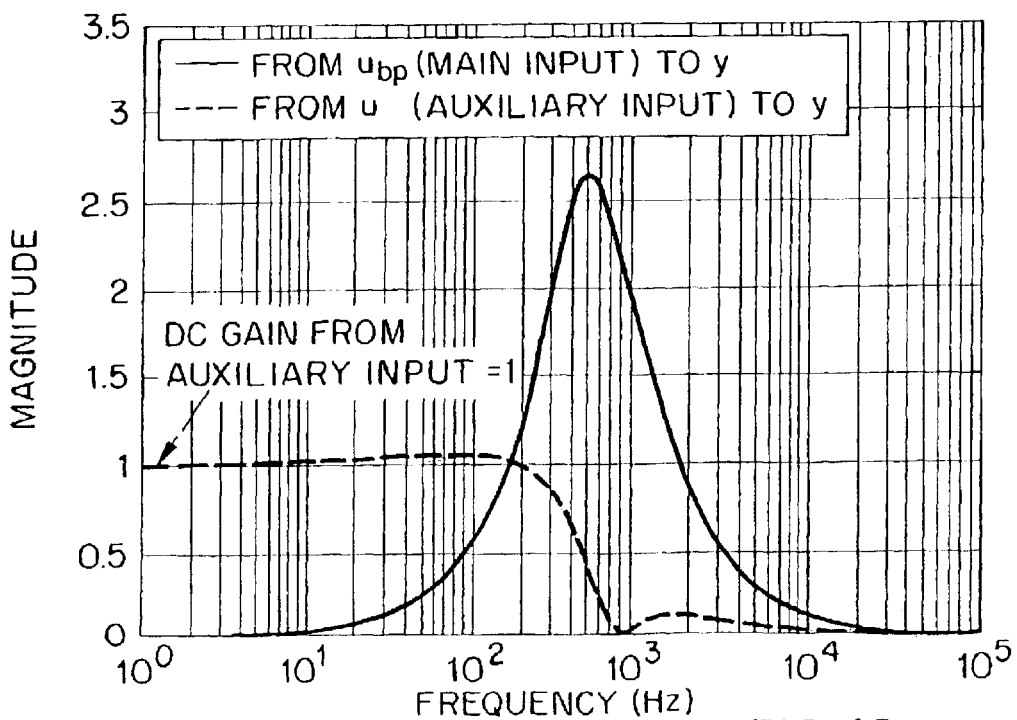
FIG. 18 is a graph of simulated frequency response of the band-pass filter of FIG. 17b.

For the application of dynamic biasing to the circuit of FIG. 17a, it might not be effective simply to add a bias to the input $u_{bp}$, because any DC components of $u_{bp}$ are blocked, by $C_{172}$, from reaching the input of the amplifier 175. In fact, in the circuit of FIG. 17a, the DC gain from the input $u_{bp}$ to the output $y_{17}$ is essentially zero. However, in accordance with the invention, this circuit can be reconfigured to provide another input through which DC signals can reach the amplifier 175. For example, as illustrated in FIG. 17b, the originally grounded end of $R_{174}$ can be disconnected from ground and used as an auxiliary input $u_{lp}$. From this auxiliary input $u_{lp}$ to the output $y_{17}$, the filter has a low-pass characteristic. Accordingly, a dynamic bias—which tends to be slowly varying—can be applied to this input $u_{lp}$. FIG. 18 illustrates exemplary simulated transfer functions of the filter of FIG. 17b, from the main and auxiliary inputs $u_{bp}$ and $u_{lp}$ to the output $y_{17}$. The component values used for the circuit simulation of FIG. 18 are: $R_{173}=R_{174}=1k\Omega$, $C_{171}=C_{172}=0.1 \mu F$, and k=8. As can be seen from FIG. 18, the transfer function from the input $u_{bp}$ of the filter to the output $y_{17}$ vanishes at both low and high frequencies. However, the transfer function from the auxiliary input $u_{lp}$ to the output $Y_{17}$ vanishes only for high frequencies. Specifically, in this example, it can be seen that the DC (i.e., very low frequency) gain is essentially zero for the main input $u_{bp}$ and 1 for the auxiliary input $u_{lp}$.

If a circuit comprises a low-pass circuit 602, as illustrated in FIG. 6, it is possible to have the same input 604 for both the bias 610 and the signal 612, yet separate outputs 606 and 608. The bias 610 and the signal 612 can, optionally, be combined using a voltage adder 614, to thereby generate the input signal 604. Furthermore, although the intended output of the circuit 602 may not be low-pass, some internal portions of the circuit can, in some cases, be adjusted even if the bias control is itself low-frequency. Such a technique can be used, for example, in topologies derived from the Tow-Thomas biquad.

Figure 19:
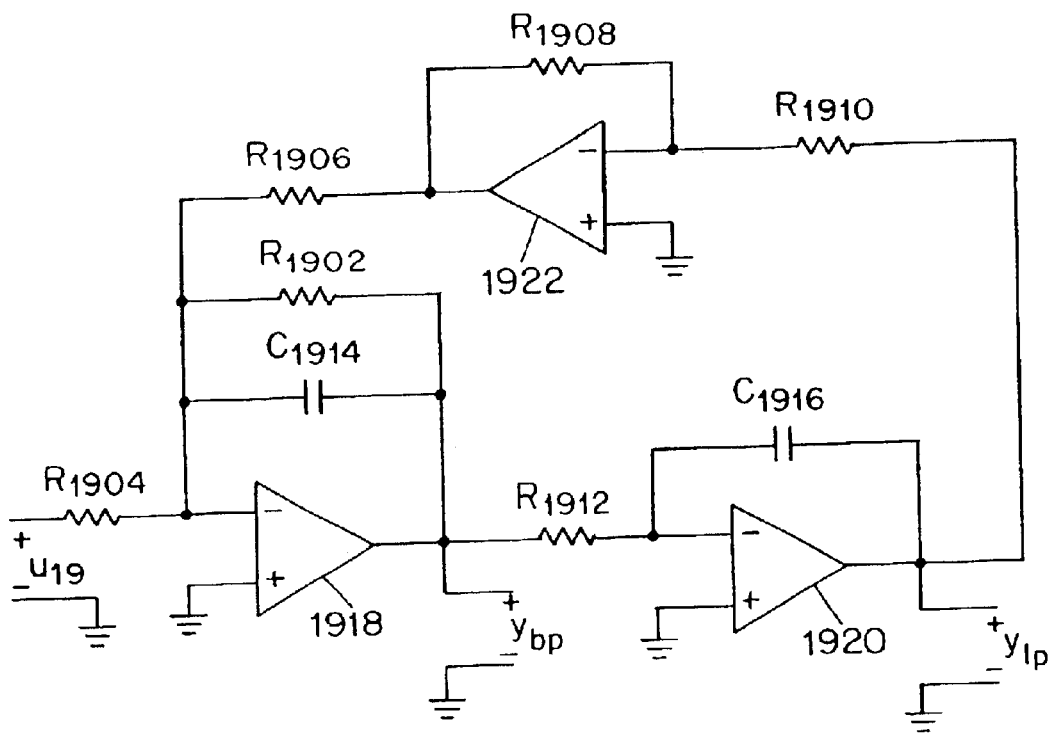
FIG. 19 is a schematic diagram illustrating an exemplary Tow-Thomas biquad circuit having band-pass and low-pass outputs.

An example of such a biquad circuit is illustrated in FIG. 19. The circuit receives an input voltage $u_{19}$ and generates a band-pass output voltage $y_{bp}$ and a low-pass output voltage $y_{lp}$. The input signal $u_{19}$ is fed through an input resistor $R_{1904}$ to the negative input terminal of a first amplifier 1918, which produces the band-pass output voltage $y_{bp}$. A feedback circuit including a resistor $R_{1902}$ and a capacitor $C_{1914}$, connected in parallel, provide coupling between the output and negative input of the first amplifier 1918. The band-pass output signal $y_{bp}$ is fed through a resistor $R_{1912}$ into the negative input of a second amplifier 1920, which generates the low-pass output voltage $y_{lp}$. A feedback capacitor $C_{1916}$ connects the output and negative input of the second amplifier 1920.

Finally, a feedback circuit connects the low-pass output $y_{lp}$ with the negative input terminal of the first amplifier 1918. The feedback circuit includes a third amplifier 1922 and three resistors $R_{1910}$, $R_{1908}$, and $R_{1906}$. Resistor $R_{1910}$ connects the low-pass output $y_{lp}$ with the negative input of the third amplifier 1922. The output of the third amplifier 1922 is connected, through $R_{1906}$, to the negative input of the first amplifier 1918. Resistor $R_{1908}$ connects the output and negative input of the third amplifier 1922. It is to be noted that any or all of the amplifiers 1918, 1920, and 1922 shown in FIG. 19 can comprise the amplifier 175 illustrated in FIG. 24. The amplifier 175 of FIG. 24 has been discussed extensively above for use in the circuits of FIGS. 17a and 17b.

In accordance with the invention, a dynamic bias can be applied to the band-pass output —which can also serve as a low-pass input—of the circuit of FIG. 19. Such a technique allows adjustment of the low-pass portion of the circuit (which includes the second amplifier 1920), thereby providing benefits such as increased energy efficiency, reduced noise, and increased dynamic range, as discussed above.

Figure 7:
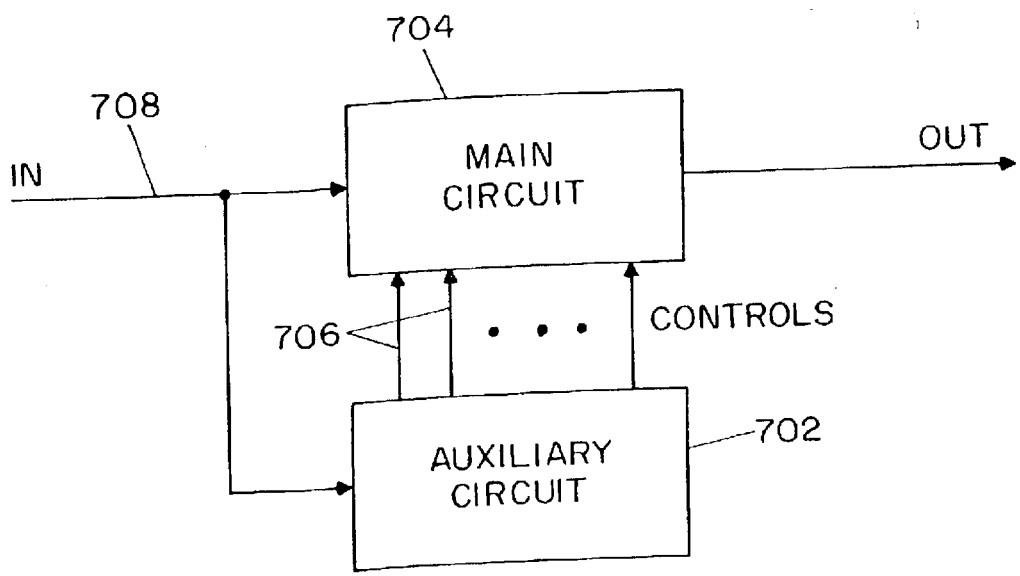
FIG. 7 is a block diagram illustrating the use of an auxiliary circuit for dynamic bias in accordance with the invention.

In some filters it may not be possible to adequately control multiple points within a filter from a single bias input, because the individual transfer functions of various portions of the circuit may be different. In such a case, it can be beneficial to use an auxiliary circuit such as shown in FIG. 7, and feed individual bias control signals 706 to multiple points in the main circuit. The auxiliary circuit 702 can be approximately similar to the main circuit 704. Individual envelope or mean value extraction circuits can, optionally, be used to generate the various outputs 706. The auxiliary circuit 702 can, optionally, be a low-pass equivalent of the main circuit 704, and can be fed by the envelope (or mean value, etc.) of the input 708, such that the individual bias control signals 706 are delayed by suitable amounts before being fed to the main circuit 704. In particular, if the main circuit 704 is a filter, there are typically phase shifts at the various internal nodes. The auxiliary circuit 702 preferably mimics these phase shifts such that the bias control signals 706 adjust the respective internal nodes of the main circuit 704 using the correct phases.

Figure 21:
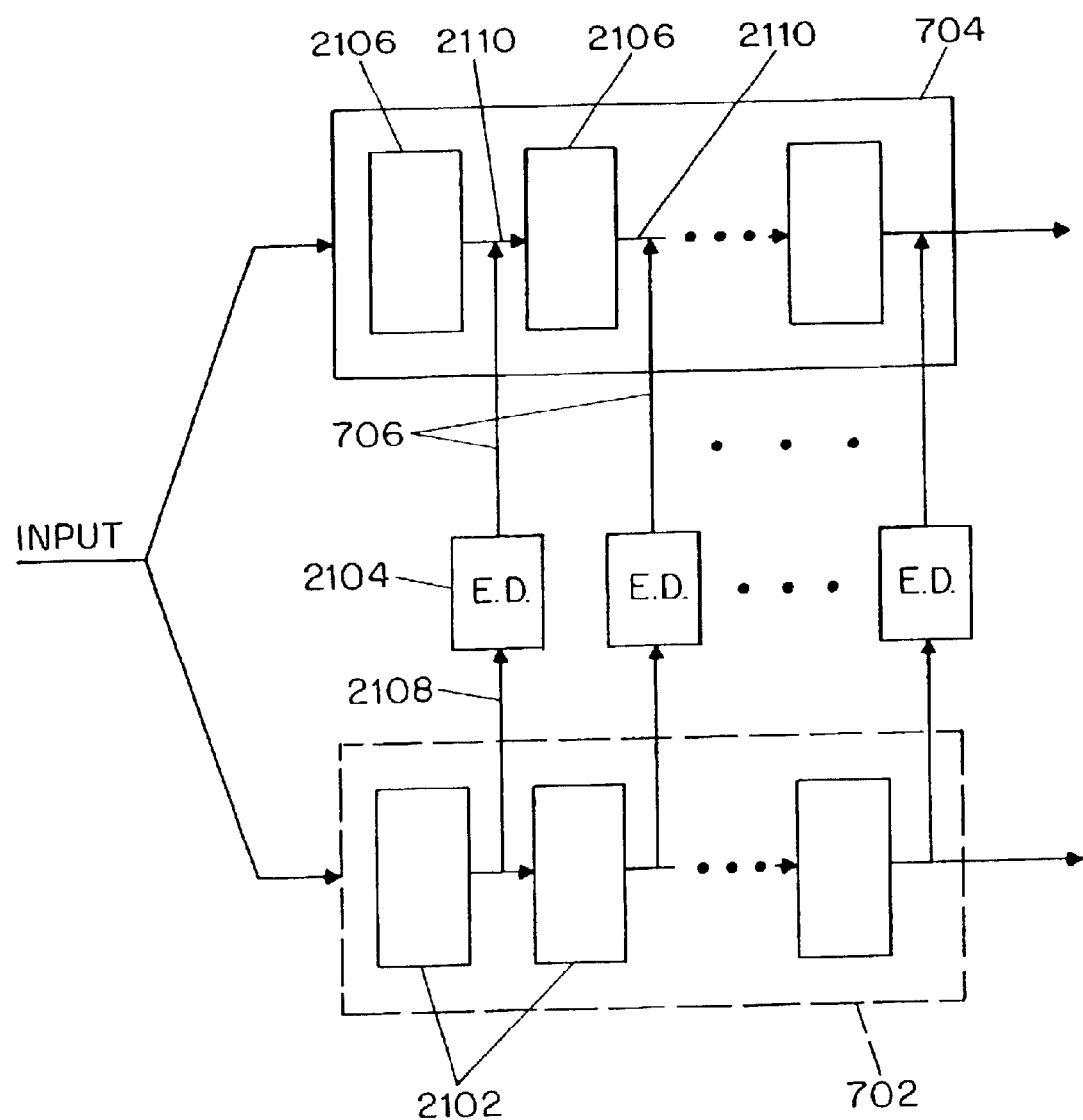
FIG. 21 is a block diagram illustrating the use of a multiple-stage auxiliary circuit in accordance with the invention.

FIG. 21 further illustrates the use of such an auxiliary circuit. The auxiliary circuit 702 of FIG. 21 includes multiple stages 2102 which can, optionally, be essentially identical to the multiple stages 2106 of the main circuit 704. Each of the stages 2102 of the auxiliary circuit produces an output signal 2108 which can be essentially identical, in both amplitude and phase, to the intermediate signals 2110 present between the respective stages 2106 of the main circuit 704. Each of the output signals 2108 is sent into its own envelope detector 2104 which generates a bias control signal 706 for the appropriate portion of the main filter 704. Because the auxiliary circuit 702 matches the main circuit 704, any phase or time shifts present in the main circuit 704 are also present in the respective outputs 2108 of the auxiliary circuit 702. As a result, each of the bias control signals 706 is phase or time shifted by the proper amount.

It may be desirable to use two matching versions of a signal-processing circuit, each fed by different polarity signals, with the outputs of the two versions being subtracted so that the bias component cancels out, as described in Arther detail below with respect to a particular log-domain circuit. In another embodiment, the signal and bias can be fed to one circuit, while the second circuit receives only the bias.

In accordance with an additional embodiment of the invention, an externally linear time-invariant filter—which can be internally non-linear—can be biased dynamically (i.e., variably) in accordance with the signal so that large signals do not overload the filter, and small signals are not buried under noise. For example, a log-domain filter can be biased in such a manner, and dynamic biasing can be used for other types of filters as well.

Figure 8A:
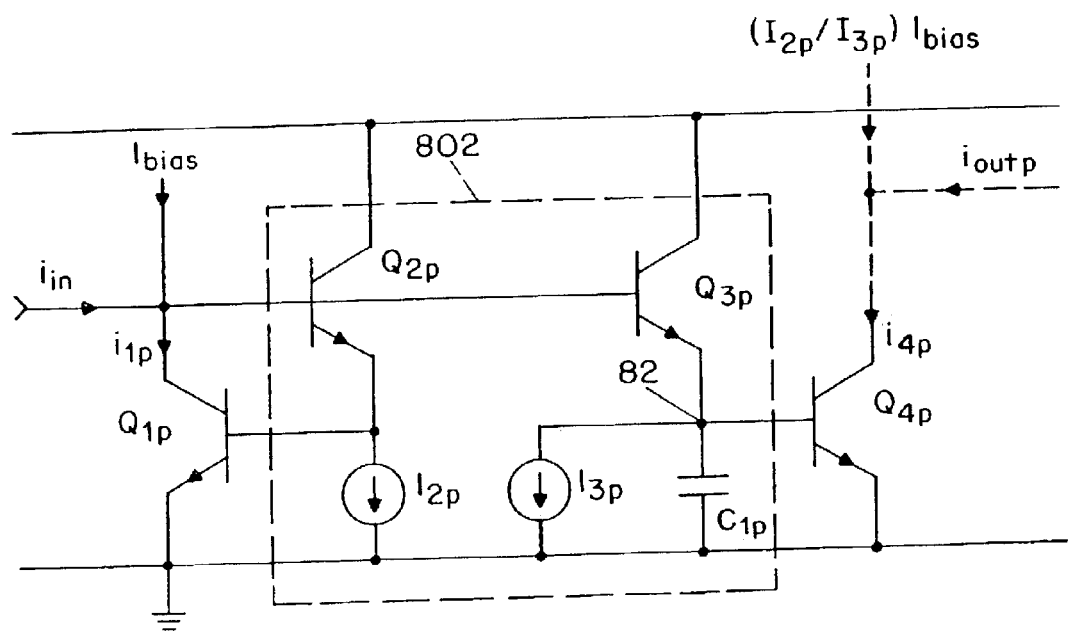
FIG. 8a is a schematic diagram illustrating a first-order log-domain filter in accordance with the invention.

FIG. 8a illustrates an example of a first-order, log-domain, low-pass filter. Such a filter generally operates by performing a logarithm operation upon an input signal, filtering the resulting logarithmic signal, and performing an exponential (i.e., anti-logarithm) operation upon the filtered signal to restore the filtered, logarithmic signal to an output signal which is linearly related to the input signal. A log-domain filter is considered a "companding" filter because it first compresses the signal and then expands it. Generally, companding filters are internally non-linear, yet they can be designed to be externally linear—ie., the output being linear with respect to the input.

Figure 15A:
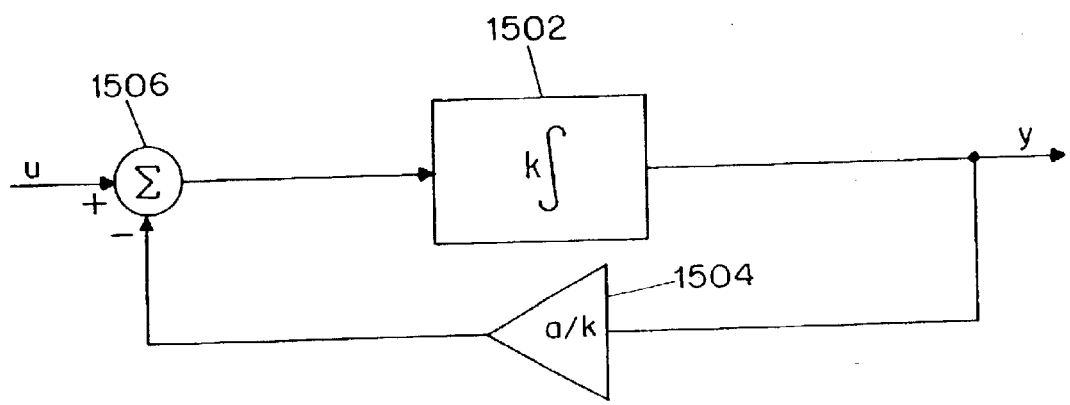
FIG. 15a is a block diagram illustrating a linear, lossy-low-pass filter.
Figure 15B:
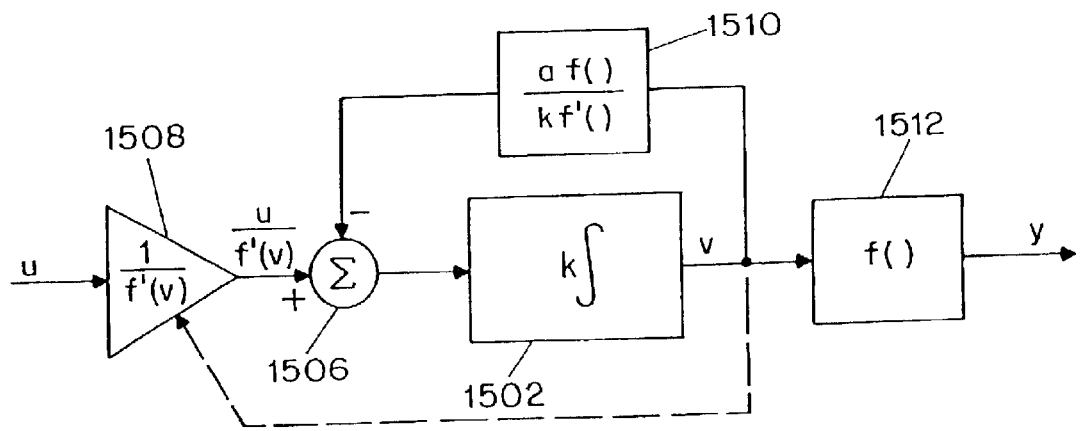

The concept of companding is further illustrated by FIGS. 15a and 15b. FIG. 15a illustrates an exemplary linear first order filter. In the filter of FIG. 15a, an integrator 1502 having a gain constant k is connected in a negative feedback loop with an amplifier 1504 having a gain of a/k. Negative feedback is provided using a differencing block 1506. The resulting circuit is a low-pass filter having the following transfer function:

$$H(s) = \frac{Y(s)}{U(s)} = \frac{k}{s+a}$$

which generally describes a low-pass filter having a bandwidth of $\alpha$ rad/s. FIG. 15b illustrates a general companding equivalent of the low-pass filter in FIG. 15a. A nonlinearity block 1512 having a non-linear function f(v) is used to provide the output y, and an amplifier 1508 having a gain of 1/f'(v), where f'(v), is the derivative of f(v), is used at the input. f(v) serves as an expander, and the amplifier with gain 1/f'(v) serves as a compressor. For example, in a log-domain filter, f(v) would be an exponential function. The compressor and expander, together with a modified feedback path 1510, form a low-pass filter that is equivalent to the linear filter of FIG. 15a and realizes the transfer function H(s) given above. The relation between the input u and the intermediate variable v is non-linear in FIG. 15b.

In the case of the circuit of FIG. 8a, assuming that all of the transistors are ideal (i.e., that their base currents are zero or negligible), the input portion of the circuit, formed by transistors $Q_{1p}$ and $Q_{2p}$, has a logarithmic voltage/current characteristic. Specifically, the base-emitter voltage of $Q_{2p}$, $V_{be2p}$, is approximately constant, and the base-emitter voltage of $Q_{1p}$, $V_{be1p}$, is proportional to the logarithm of the normalized input currents: $V_{be1p} = V_t \ln[(i_{in}+I_{bias})/I_s]$. Therefore, the base voltage of $Q_{2p}$, $V_{b2p}$, is:

$$V_{b2p} = V_{be2p} + V_t \ln[(i_{in}+I_{bias})/I_s],$$

where $V_t$ is the thermal voltage of $Q_{2p}$ and $I_s$ is the saturation current of $Q_{2p}$.

The filter uses transistor $Q_{3p}$ to send the logarithmic component of $V_{b2p}$ into the base of transistor $Q_{4p}$. At low frequencies, the output portion of the circuit, formed by transistor $Q_{4p}$, produces a current $i_{4p}$, into the collector of $Q_{4p}$, which is exponentially related to the base voltage of $Q_{4p}$:

$$i_{4p} = K \exp\{\ln[(i_{in}+I_{bias})/I_s]\} = K[(i_{in}+I_{bias})/I_s],$$

where K is a constant.

Accordingly, the relationship between the input signal $i_{in}$ and the output signal $i_{outp}$ is ultimately linear. Low-pass filtering is provided by a high-frequency shunt—in this case, the capacitor $C_{1p}$—which shorts out high-frequency signals at the base of $Q_{4p}$. Ideally, in a log-domain filter, the relationship between the large signal currents $i_{1p}$ and $i_{4p}$ in the input and output transistors $Q_{1p}$ and $Q_{4p}$, respectively, is linear and time invariant—assuming that $i_{1p}$ is always positive. Assuming that the base currents of $Q_{2p}$ and $Q_{3p}$ are negligible, $i_{1p}$ is the sum of an AC input signal $i_{in}$ and a bias current $I_{bias}$. $I_{bias}$ is typically constant. The output $i_{outp}$ is obtained by subtracting $(I_{2p}/I_{3p})I_{bias}$ from $i_{4p}$. $I_{2p}/I_{3p}$ is the DC gain of the filter.

In accordance with the invention, dynamic biasing can be applied to circuits such as the filter of FIG. 8a, by varying $I_{bias}$ in accordance with the envelope of the input $i_{in}$ so that $I_{bias}$ is slightly larger than the minimum value required to keep $i_{1p}$ positive at all times. Such dynamic biasing lowers the power consumption and the output noise of the filter for small inputs, while enabling the circuit to accommodate very large inputs without excessive distortion.

Dynamic biasing also alters the "gain" from the input current to the internal voltages. Gain alteration has also been used for syllabic companding, which involves slowly varying the gain of an input amplifier in order to accommodate varying signal sizes and to maintain a relatively constant-amplitude output signal. However, dynamic biasing is simpler to implement than syllabic companding. On the other hand, in dynamic biasing systems, the time varying $I_{bias}$ is filtered along with the input signal, and is also included in the output signal. Accordingly, $i_{outp}$ is no longer merely a filtered version of $i_{in}$, but also includes a filtered version of $I_{bias}$. Consequently, it can be preferable to use a compensation circuit for some applications, in order to compensate for the presence of the filtered $I_{bias}$ signal in the output signal.

Figure 22:
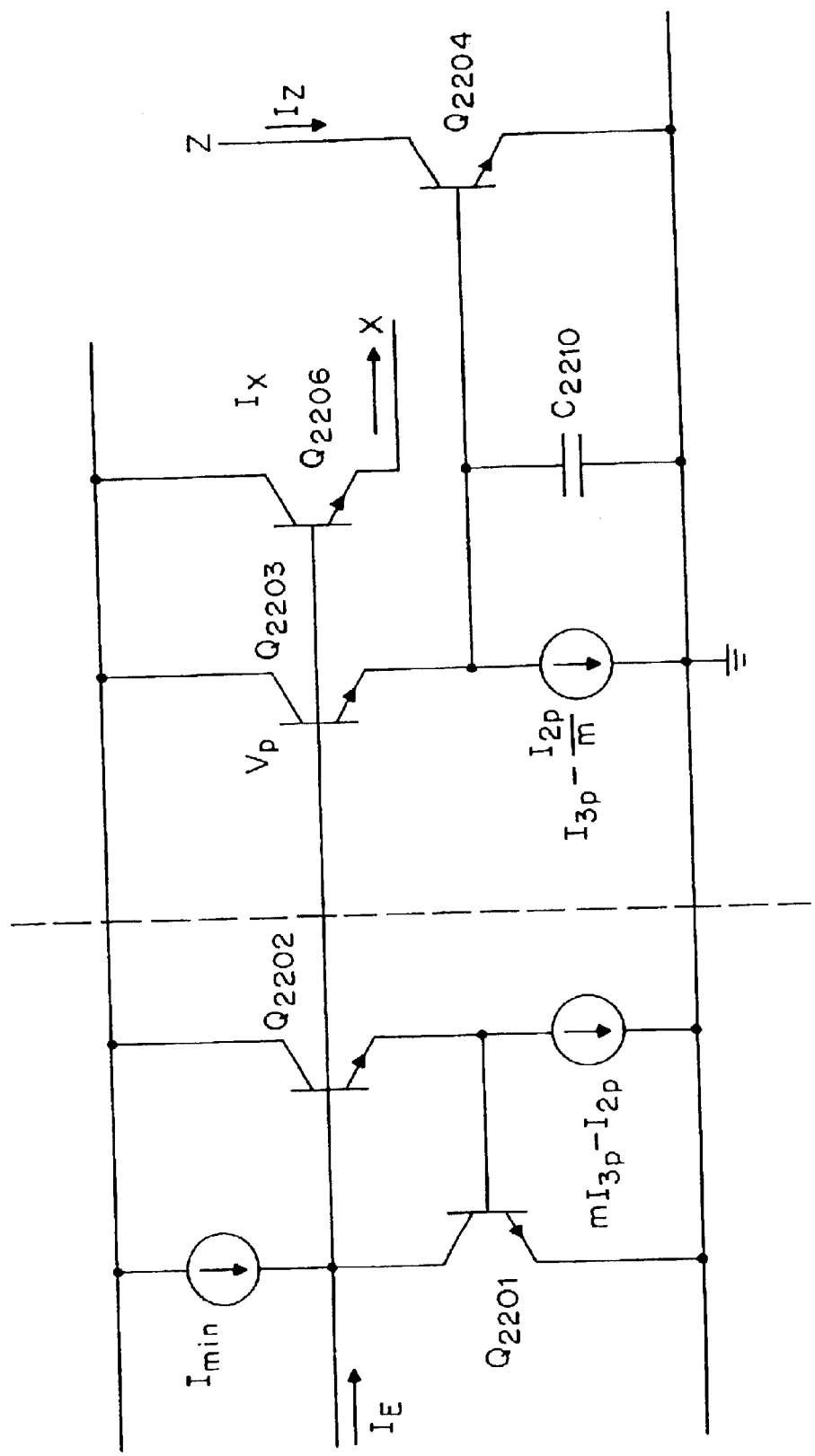
FIG. 22 is a schematic diagram illustrating a compensation circuit in accordance with the invention.

An example of such a compensation circuit is illustrated in FIG. 22. The circuit of FIG. 22 is similar to the circuit for which compensation is desired—i.e., the circuit of FIG. 8a. In particular, the compensation circuit of FIG. 22 includes transistors $Q_{2201}$, $Q_{2202}$, $Q_{2203}$, and $Q_{2204}$, which behave similarly to the transistors $Q_{1p}$, $Q_{2p}$, $Q_{3p}$, and $Q_{4p}$, respectively, of the filter of FIG. 8a. Capacitor $C_{2210}$ of FIG. 22 provides low-pass filtering similarly to capacitor $C_{1p}$ of FIG. 8a. However, the compensation circuit of FIG. 22 includes an additional transistor $Q_{2206}$ which mirrors the current flowing through $Q_{2203}$. The emitter current $I_x$ of $Q_{2206}$ is fed into the node 82 (in FIG. 8a) to which the emitter of $Q_{3p}$ is connected. A current source $I_{min}$ provides bias current into the collector of $Q_{2201}$.

The compensation circuit receives, into the collector of $Q_{2201}$, the envelope $I_E$ of $i_{in}$, rather than $i_{in}$ itself. For larger amplitude input signals, $I_E$ increases, causing an increase in the current flowing through $Q_{2203}$. The increased current in $Q_{2203}$ causes an increase in the current $I_x$ which flows into node 82 of the filter of FIG. 8a, thereby increasing the base voltage of $Q_{4p}$. As a result, the quiescent (i.e. bias) current flowing through $Q_{4p}$ is increased, thereby enabling the exponentiator stage of the filter of FIG. 8a to accommodate the larger input signal $i_{in}$ which is being received.

If the amplitude of $i_{in}$ decreases, $I_E$ decreases, which reduces $I_x$. The voltage at node 82 drops, thereby decreasing the bias current flowing through $Q_{4p}$. Consequently, power consumption and shot noise are reduced for input signals having smaller amplitudes.

Moreover, there is an additional method for distortionless dynamic biasing. In accordance with the invention, a single-ended filter such as the circuit illustrated in FIG. 8a is duplicated. The duplicate circuit is operated with the same bias $I_{bias}$ but an inverted input $-i_{in}$, as shown in FIG. 8b.

Figure 8B:
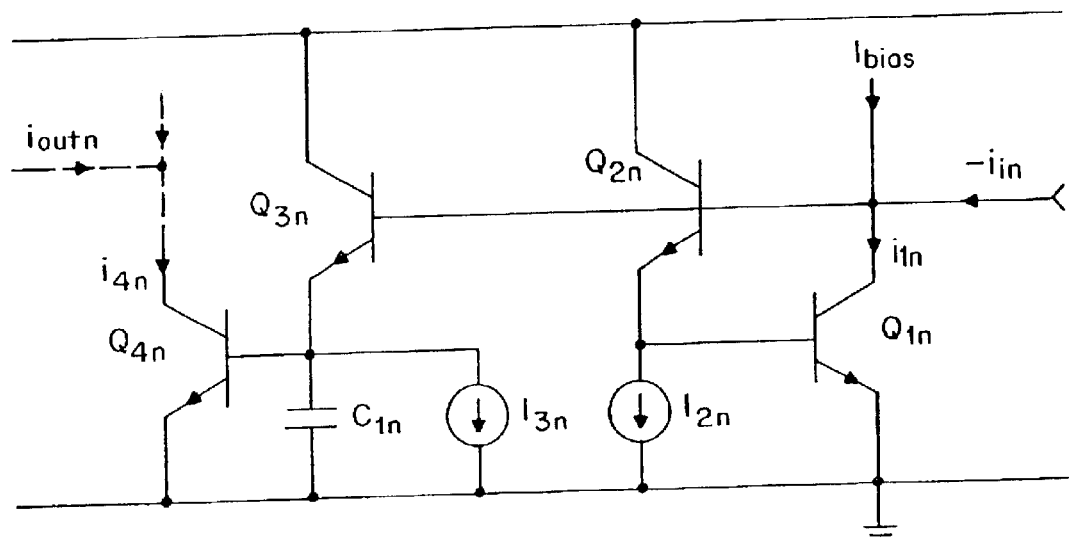
FIG. 8b is a schematic diagram illustrating a replica of the circuit of FIG. 8a, in accordance with the invention.

The duplicate circuit, an example of which is illustrated in FIG. 8b, includes transistors $Q_{1n}$, $Q_{2n}$, $Q_{3n}$, and $Q_{4n}$ which correspond to transistors $Q_{1p}$, $Q_{2p}$, $Q_{3p}$, and $Q_{4p}$ of the original circuit, illustrated in FIG. 8a. The circuit of FIG. 8b also includes current sources $I_{2n}$ and $I_{3n}$—which are of approximately equal value to $I_{2p}$ and $I_{3p}$, respectively, of the original circuit. Capacitor $C_{1n}$ of the duplicate circuit is approximately equal in value to $C_{1p}$ of the original circuit. The output transistor currents $i_{4p}$ and $i_{4n}$ in the respective filters of FIGS. 8a and 8b can be written as:

$$i_{4p}(t)=(i_{in}(t)+I_{bias}(t))*h(t); i_{4n}(t)=(-i_{in}(t)+I_{bias}(t))*h(t), \quad (1)$$

where h(t) is the impulse response of each filter (i.e., the impulse response between $i_{1p}$ and $i_{4p}$, and between $i_{1n}$ and $i_{4n}$, where all base currents are assumed to be zero or negligible) and "*" denotes convolution. In the differential output $i_{out}=i_{4p}-i_{4n}$, the bias dependent term $I_{bias}$ (t) * h(t) cancels out, giving the result: $I_{out}(t)=2i_{in}(t)$ * h(t). The relation between $i_{out}$ and $i_{in}$ is therefore linear and time invariant, and is the same (except for a factor of 2) as that between $i_{outp}$ and $i_{in}$ in the original log-domain filter (the circuit of FIG. 8a) operating with a constant bias. No extra circuitry is required to compensate for the effect of $I_{bias}$, because $I_{bias}$ is not present in the output.

Figure 9A:
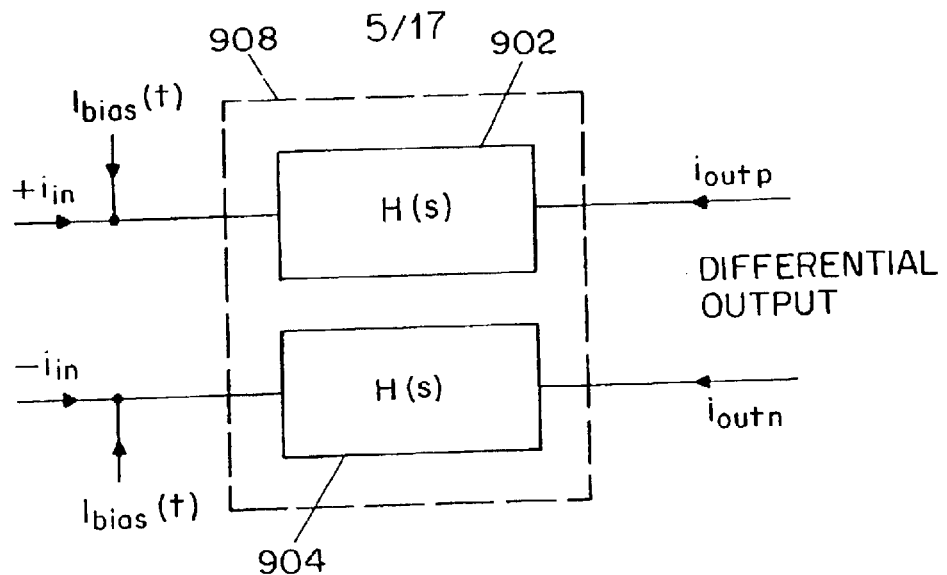
FIG. 9a is a block diagram illustrating a circuit having a differential output in accordance with the invention.

In accordance with the invention, a dynamically biased log-domain filter can be operated pseudo-differentially to cancel the effects of time varying bias, as illustrated in FIG. 9a. For example, two matching circuits 902 and 904—which can be, for example, the circuits of FIGS. 8a and 8b—can be used in the differential configuration illustrated in FIG. 9a. The input signal of such a configuration would be $2i_{in}$, and the output signal would be $i_{4p}-i_{4n}$. Such a configuration can eliminate the need to provide a bias current of $(I_{2p}/I_{3p})I_{bias}$ into transistor $Q_{4p}$, or a bias current of $(I_{2n}/I_{3n})I_{bias}$ into transistor $Q_{4n}$. Furthermore, structures that operate using differential input (e.g. certain class-AB circuits) can also be used in FIG. 9a. Such a differential circuit 908 is represented by the dotted lines of FIG. 9a.

In addition to cancellation of the bias dependent terms, pseudo-differential operation has benefits such as cancellation of even-order non-linearities and common mode interferences. For example, if the elements of a circuit are non-ideal—e.g., if the transistors in a log-domain filter have characteristics which deviate from ideal logarithms and exponentials—the input and bias signals can interact with the non-idealities to generate harmonics, especially even-order harmonics. Because even-order harmonics have the same sign and approximately the same values in both halves of a pseudo-differential circuit, these harmonics cancel, thereby providing improved signal quality.

Furthermore, if $I_{bias}$ contains noise, approximately the same noise signal, with the same sign, is present in each half of the circuit. Consequently, noise signals introduced by $I_{bias}$ are cancelled in the differential output. In contrast, the input signal $i_{in}$ is present with opposite signs in the respective halves of the circuit. Therefore, the input signal is not canceled in the differential output. As a result, the circuit of FIG. 9a provides an improved signal-to-noise ratio.

Figure 9B:
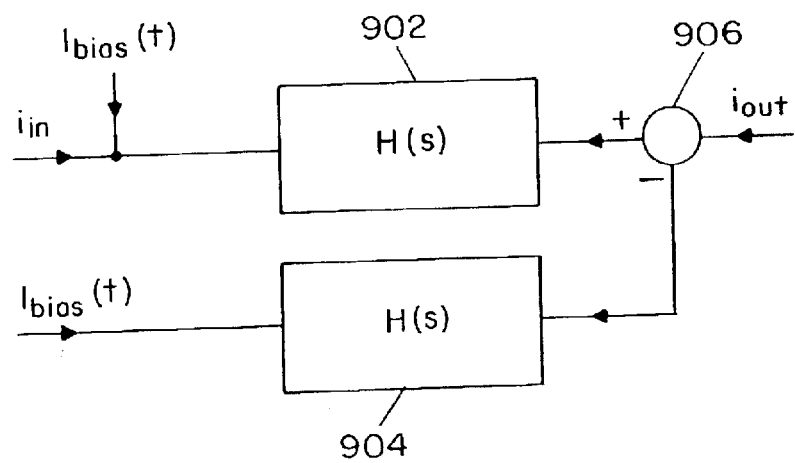
FIG. 9b is a block diagram illustrating a circuit having a single-ended output in accordance with the invention.

In accordance with another aspect of the invention, the scheme shown in FIG. 9b, in which the second filter 904 receives only the bias signal, can be used. The technique of supplying the input signal to only one of the filters can be advantageous for applications in which single-ended input is desired. Either of the arrangements of FIGS. 9a and 9b can, optionally, include a differencing block 906 at the output, which can be advantageous for applications in which single-ended output is desired. Single-ended input and/or output can be desirable for, e.g., for proper interfacing with other circuits.

The linear time-invariant relation between the input and output transistor currents in a log-domain filter enables the cancellation of time varying bias components at the output. In contrast, if time varying gains are placed before and after a classical linear filter, pseudo-differential operation does not result in a linear time-invariant system.

The base emitter voltage of $Q_{1p}$ in FIG. 8a is given by: $V_{belp} = V_t \ln[(i_{in}+I_{bias})/I]$. An increase in the envelope of $i_{in}$ by a factor $\alpha$ causes $I_{bias}$ to increase by the same factor because $I_{bias}$ is derived from the envelope of $i_{in}$. In other words, $i_{in1}$ becomes $i_{in2}=\alpha i_{in1}$ and $I_{bias1}$ becomes $I_{bias2}=\alpha I_{bias1}$, where $i_{in1}$ and $I_{bias1}$ are the initial values of $i_{in}$ and $I_{bias}$, and $i_{in2}$ and $I_{bias2}$ are the new values. Therefore, $V_{belp1}$ (the initial value) becomes $V_{belp2}$ (the new value):

$$V_{belp2}=V_t \ln[\alpha(i_{in1}+I_{bias1})/I_s]=V_t \ln[(i_{in1}+I_{bias1})/I_s + V_t \ln(\alpha) = V_{belp1} + V_t \ln(\alpha).$$

It can thus be seen that $V_{belp}$ undergoes only a DC shift equal to $V_t \ln(\alpha)$. Because of the linearity between $i_{1p}$ and $i_{4p}$, it can be seen that $V_{be4p}$ also undergoes only a DC shift. Therefore, the AC signal applied to the voltage-mode filter 802 between the input and output transistors (enclosed by dashed lines in FIG. 8a) remains the same regardless of the input signal strength if dynamic biasing is used. This confirms the analogy of dynamic biasing to syllabic companding. Like syllabic companding, dynamic biasing also increases the dynamic range of a log-domain filter.

Figure 14:
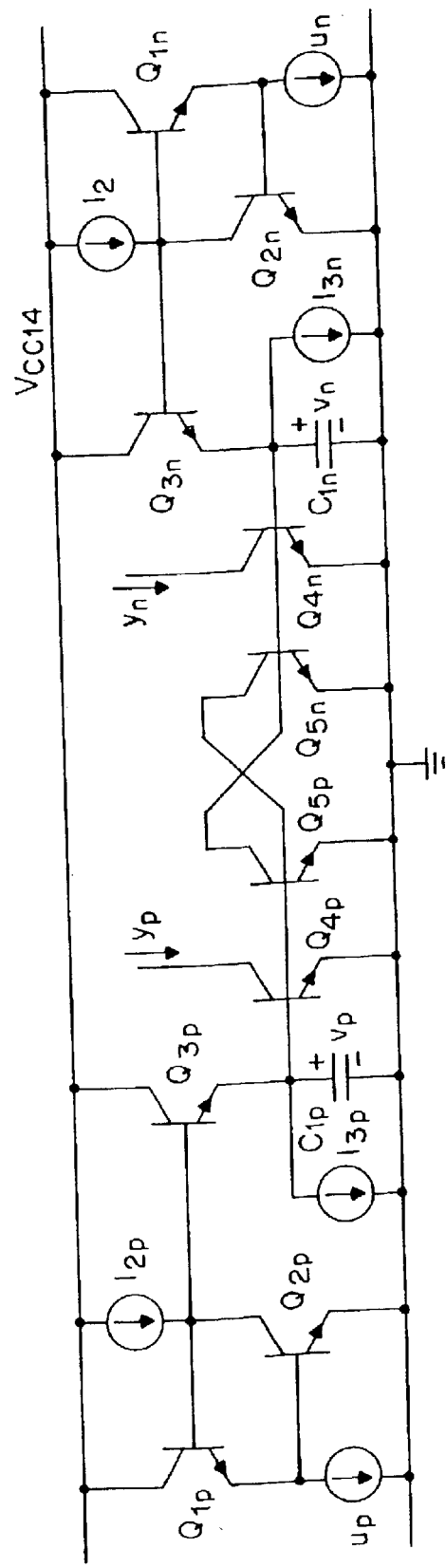
FIG. 14 is a schematic diagram illustrating a class-AB log-domain filter in accordance with the invention.

FIG. 14 illustrates an exemplary class-AB instantaneous companding log-domain filter which can be dynamically biased in accordance with the invention. The filter of FIG. 14 incorporates log-domain filters similar to those of FIGS. 8a and 8b, in accordance with the invention. The left half of the filter includes transistors $Q_{1p}$ and $Q_{2p}$ which perform a logarithm operation upon the signal $u_p$ entering the left half. Transistors $Q_{3p}$ and $Q_{4p}$ restore the left half of the signal to linearity by performing an exponential operation upon the logarithmic signal. Capacitor $C_{1p}$, which serves as a high-frequency shunt, provides low-pass filtering. $Q_{2p}$ is biased with a bias current $I_{2p}$, and $Q_{3p}$ is biased with a bias current $I_{3p}$. The right half of the filter includes components $Q_{1n}$, $Q_{2n}$, $Q_{3n}$, $Q_{4n}$, and $C_{1n}$ which perform the same functions—in the right half—as $Q_{1p}$, $Q_{2p}$, $Q_{3p}$, $Q_{4p}$ and $C_{1p}$ perform in the left half. The two halves of the filter are cross-coupled using transistors $Q_{5p}$ and $Q_{5n}$.

The difference current $u_p-u_n$ is the input to the filter, and the difference current $y_p-y_n$ is the output. The filter can operate in a class-AB mode in which the left half of the circuit handles positive portions of the input signal—i.e., when $u_p$ is positive and $u_n$ is negative—and the right half handles negative portions of the input signal—i.e., when $u_p$ is negative and $u_n$ is positive.

Figure 10A:
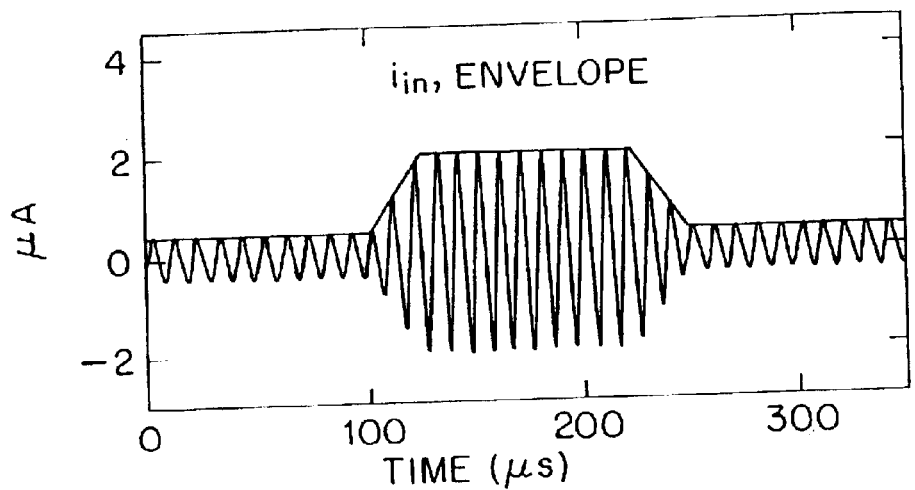
FIG. 10a is a graph of input current, and the envelope thereof, being received by a circuit in accordance with the invention.
Figure 10B:
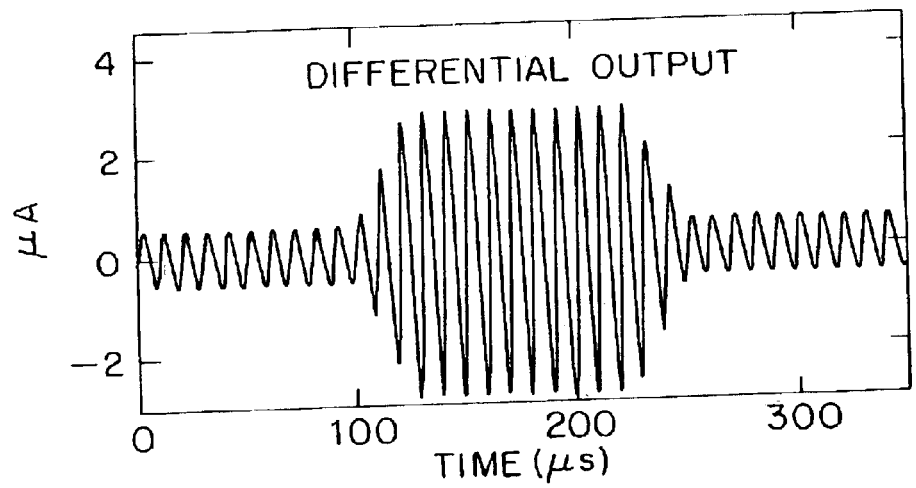
FIG. 10b is a graph of differential output of a circuit in accordance with the invention.
Figure 10C:
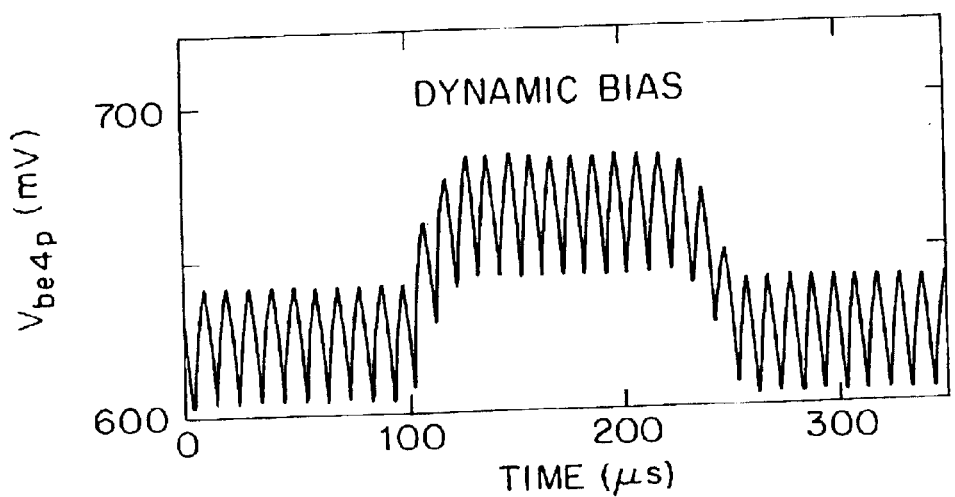
FIG. 10c is a graph of voltage at a node within a circuit in accordance with the invention, wherein the circuit is dynamically biased.
Figure 10D:
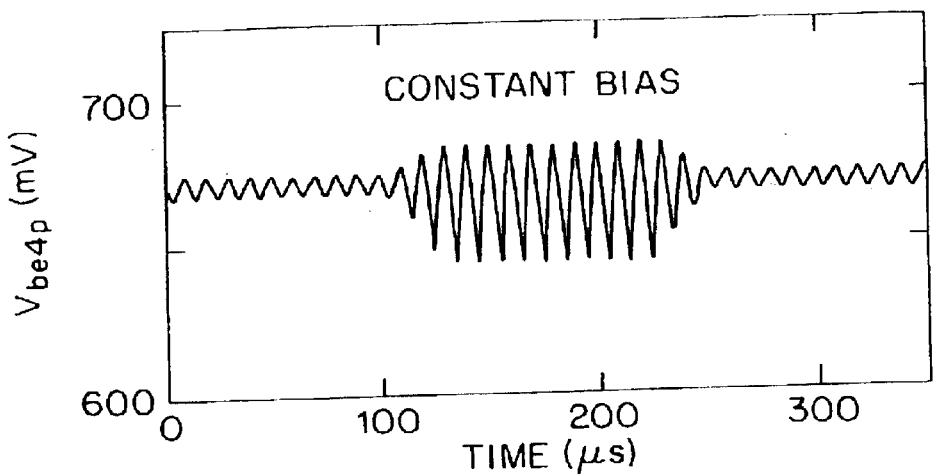
FIG. 10d is a graph of voltage at a node within a circuit in accordance with the invention, wherein the circuit has a constant bias.
Figure 10E:
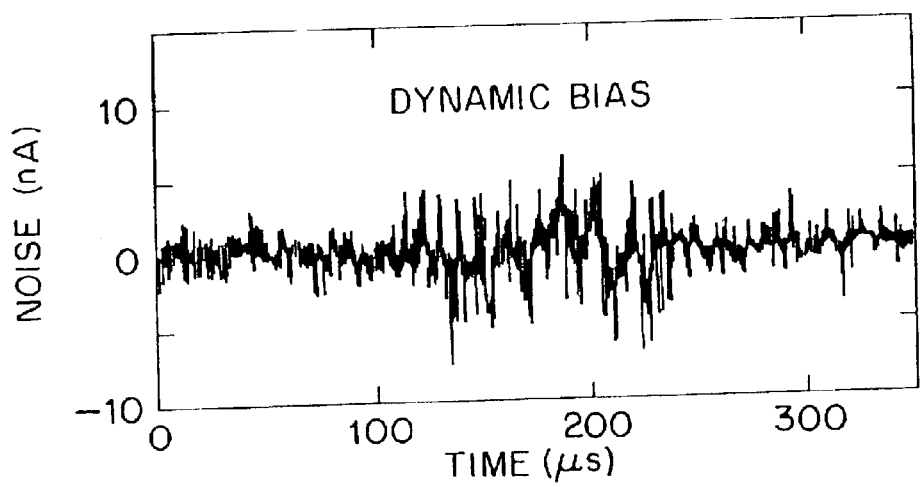
FIG. 10e is a graph of noise current of a circuit in accordance with the invention, wherein the circuit is dynamically biased.
Figure 10F:
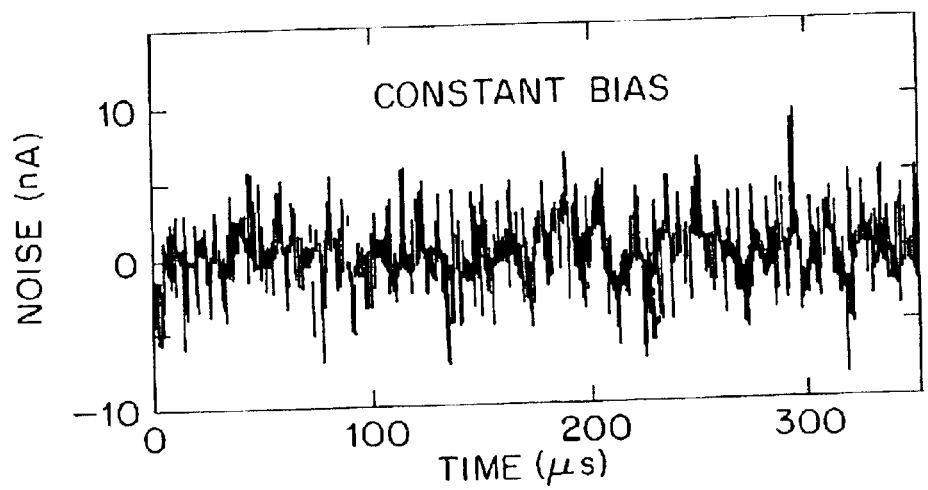
FIG. 10f is a graph of noise current in a circuit in accordance with the invention, wherein the circuit has a constant bias.

FIGS. 10a–10f illustrate the results of a simulation, in accordance with the invention, of an exemplary pseudo-differential configuration of the low-pass filters of FIGS. 8a and 8b, where the combined filter was configured to have a −3 dB frequency of 100 kHz ($I_{2p}=I_{3p}=1$ μA, $C_{1p}=61.5$ pF). The input was a sinewave with a changing envelope (FIG. 10a). The circuit was simulated in two different modes of operation: (i) with a dynamic bias 10% larger than the changing envelope, and (ii) with a constant bias 10% larger than the largest envelope (the largest envelope being 2 μA, as illustrated in FIG. 10a). The constant bias case corresponds to classical class-A operation. The outputs of the filter in the two different modes are plotted in FIG. 10b and are identical in this simulation. FIGS. 10c and 10d show the base emitter voltage of $Q_{4p}$ (a voltage internal to the filter) in the two cases. Syllabic companding is clearly seen in FIG. 10c—the internal voltage swing is constant regardless of the input amplitude. With a constant bias, the amplitude of the internal voltage varies with the input current, as can be seen in FIG. 10d. The results of transient noise simulations are shown in FIGS. 10e and 10f. It is evident from these figures that dynamic biasing provides noise reduction for small input signals. These results demonstrate the external linearity and syllabic companding nature of the dynamically biased filter.

The technique of the invention provides several advantages over conventional circuits. First, compensation circuits used in conventional circuits require extra design effort, in some cases as much as for the main filter, and add to the power consumption and noise of the overall filter. In contrast, the method of the invention—illustrated by example in FIG. 9a—has no additional design overhead because the required filter is simply duplicated. Furthermore, the technique of the invention introduces no additional power consumption or noise because there is no "extra" circuitry other than the filter used to differentially process the input signal.

Figure 25:
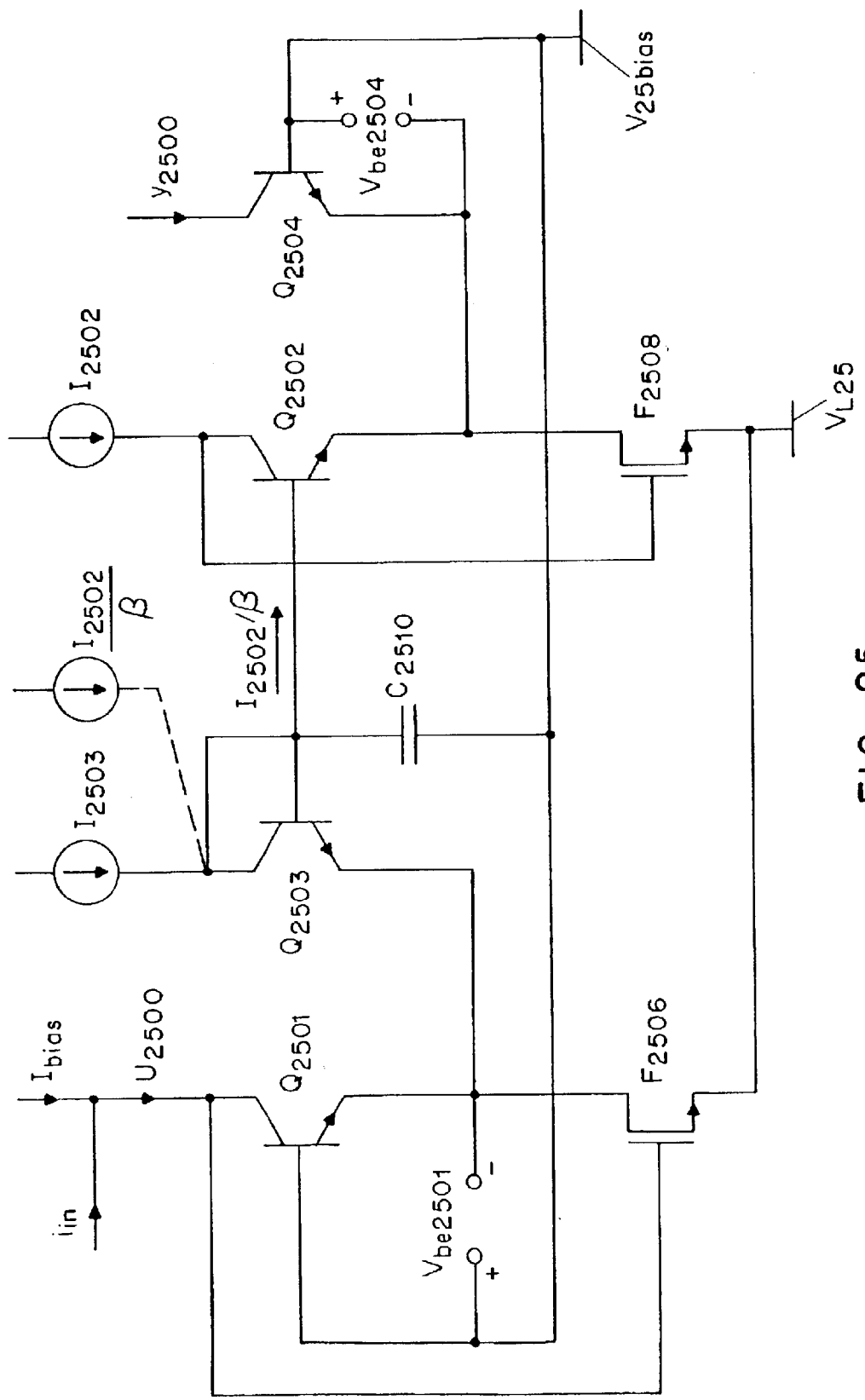
FIG. 25 is a schematic diagram illustrating a log-domain filter in accordance with the invention.

FIG. 25 illustrates an additional example of a log-domain filter which can be dynamically biased in accordance with the invention. Similarly to the log-domain filter of FIG. 8a, the log-domain filter of FIG. 25 can be used in one or both of filter blocks 902 and 904 of the circuits of FIGS. 9a and 9b. The filter of FIG. 25 receives an input signal $u_{2500}$ which, if the filter is used in block 902 of one of the circuits of FIGS. 9a and 9b, equals $i_{in}+I_{bias}$. Transistors $Q_{2501}$, $Q_{2502}$, and $Q_{2503}$ are biased with currents $I_{bias}$, $I_{2502}$, and $I_{2503}$, respectively. The output signal $y_{2500}$ is the collector current of transistor $Q_{2504}$. The emitters of $Q_{2501}$ and $Q_{2503}$ are connected to each other, as are the emitters of $Q_{2502}$ and $Q_{2504}$. A bias voltage $V_{25bias}$ fixes the base voltages of $Q_{2501}$ and $Q_{2504}$. The bases of $Q_{2502}$ and $Q_{2503}$ are connected to each other, and are also connected to $V_{25bias}$ through a capacitor $C_{2510}$.

A FET $F_{2506}$ is used, in a feedback arrangement, to control the current flowing through $Q_{2501}$. The FET $F_{2506}$ serves as a regulated current source. The source terminal of $F_{2506}$ is connected to a voltage source $V_{L25}$. The drain of $F_{2506}$ is connected to the emitter of $Q_{2501}$. The gate of $F_{2506}$ is connected to the collector of $Q_{2501}$. If $Q_{2501}$ is in a region of its operating characteristic—i.e., its current-voltage characteristic—in which its collector current would tend to exceed $u_{2500}$, the collector voltage of $Q_{2501}$ drops, causing the gate voltage of $F_{2506}$ to drop. The drop in gate voltage causes the drain current of $F_{2506}$ to decrease, which increases the emitter voltage of $Q_{2501}$. The increase in emitter voltage decreases the base-emitter voltage $V_{be2501}$ of $Q_{2501}$, which tends to cause a decrease in the collector current of $Q_{2501}$. If, on the other hand, $Q_{2501}$ is in a region of its operating characteristic in which its collector current would tend to be less than $u_{2500}$, the opposite result occurs: $V_{be2501}$ is increased, which tends to cause an increase in the collector current of $Q_{2501}$. In equilibrium, the collector current and base-emitter voltage $V_{be2501}$ of $Q_{2501}$ are thus regulated to maintain the transistor $Q_{2501}$ in a region of its operating characteristic in which the collector current of $Q_{2501}$ is exponentially dependent upon the base-emitter voltage $V_{be2501}$, and in which the base-emitter voltage $V_{be2501}$ is logarithmically related to the collector current of $Q_{2501}$.

As a result, $Q_{2501}$ performs a logarithm operation on $u_{2500}$, thereby generating $V_{be2501}$. Because the base voltage of $Q_{2501}$ is fixed by $V_{25bias}$, the resulting logarithm signal is present at the emitters of $Q_{2501}$ and $Q_{2503}$. Because the base and collector of $Q_{2503}$ are connected together, $Q_{2503}$ acts as a diode which communicates the logarithm signal to the base of $Q_{2502}$. High-frequency signal components are suppressed by a high-frequency shunt—in this case, capacitor $C_{2510}$— connected between the base of $Q_{2502}$ and voltage source $V_{25bias}$. $Q_{2502}$ is biased by a current $I_{2502}$. The collector current and base-emitter voltage of $Q_{2502}$ are regulated by a FET $F_{2508}$ which operates similarly to the FET $F_{2506}$ which regulates the collector current and base-emitter voltage $V_{be2501}$ of $Q_{2501}$.

Transmitter $Q_{2502}$ communicates the low-pass-filtered, logarithm signal from the base of $Q_{2502}$ to the emitter of $Q_{2502}$, this emitter being connected to the emitter of $Q_{2504}$. Because the base voltage of $Q_{2504}$ is fixed by voltage source $V_{25bias}$, the filtered, logarithm signal is induced in the base-emitter voltage $V_{be2504}$ of $Q_{2504}$. Because the output signal $y_{2500}$ is exponentially related to $V_{be2504}$, transistor $Q_{2504}$ exponentiates the filtered, logarithm signal which is present in $V_{be2504}$, thereby restoring the signal to linearity. Consequently, $y_{2500}$ is linearly related to $u_{2500}$. The transfer function between $y_{2500}$ and $u_{2500}$ is:

$$H_{2500}(s)=Y_{2500}(s)/U_{2500}(s)=(I_{2502}/I_{2503})/(1+sC_{2510}V_t/I_{2503}),$$

where $V_t$ is the thermal voltage of the various transistors in FIG. 25.

Even if the current gains of the transistors are finite, the only base current that significantly affects the operation of the circuit is that of $Q_{2502}$. However, the base current of $Q_{2502}$ is a constant $I_{2502}/\beta$ which is subtracted from $I_{2503}$. Consequently, no significant additional nonlinearity is introduced into the circuit, and the only effect of the finite $\beta$—assuming that $\beta$ is constant with respect to the collector currents—is a reduction of the bandwidth of the filter. If this bandwidth reduction is undesirable, it can be counteracted either by injecting a current $I_{2502}/\beta$, as illustrated in FIG. 25, or by using automatic tuning techniques known to those skilled in the art.

Instantaneous companding via class-AB or class-B operation is another technique which has been used to realize high dynamic range log-domain filters. In this technique, a differential filter receives an input signal which equals the difference of half-wave rectified or geometrically split currents.

However, the technique of the invention provides several advantages over class-AB instantaneous companding. For example, in a preprocessing circuit in accordance with the invention, the accuracy of the envelope detector is less important, provided that its output is larger than the actual envelope. In contrast, a class-AB splitter generally must accurately reproduce the input signal in the splitter's difference output in order to avoid added distortion. For at least this reason, the envelope detector of the invention is simpler to design than a class-AB splitter. Furthermore, in conventional circuits, mismatch of circuit elements can lead to distortion because of internal non-linearity (in class-AB filters) and incomplete cancellation of bias components (in dynamically biased filters). For example, various frequency components of the input signal can interact with circuit nonlinearities to cause intermodulation distortion, i.e., spurious signals at various sum and difference frequencies of the various frequency components. In fact, in a conventional companding filter, if internal components deviate from their ideal nonlinear (e.g., ideal logarithm or ideal exponential) characteristics, such deviation can also result in distortion. In contrast, circuits in accordance with the invention tend to produce slowly varying bias components which, in many cases, can be more acceptable than intermodulation distortion. In addition, noise from the envelope detector of the invention cancels at the output of the filter. In contrast, the two outputs of a conventional class-AB splitter contain noise in opposite phases of the input for large signals; such noise does not cancel at the filter's output, and the uncanceled noise can degrade the signal-to-noise ratio of the filter.

Figure 11:
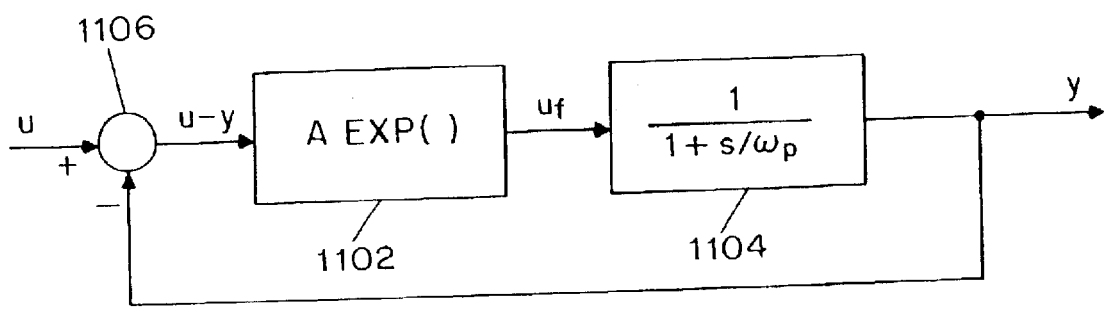
FIG. 11 is a block diagram illustrating an envelope detector in accordance with the invention.

The bias $I_{bias}$ in FIGS. 8a, 8b, 9a, 9b, and 25 can be generated using an envelope detector which can be, for example, a current mode envelope detector in accordance with the invention. FIG. 11 provides a block diagram of such a circuit. The output y of the detector is subtracted from the input u of the detector using a differencing block 1106. The output u−y of the differencing block 1106 is fed into an exponentiating block 1102 to produce an exponentiated error $u_f$. A low pass filter 1104 having a cutoff frequency $\omega_p$ filters the exponentiated error $u_f$ to produce the output y.

To better understand the operation of the envelope detector of FIG. 11, it is useful to consider a case in which the input u is a sine wave having an angular frequency much larger than $\omega_p$, and the output y is less than the envelope of u. During the portions of the input cycle in which u exceeds y, the output $u_f$ of the exponential becomes extremely large. Because of the large signal entering the low-pass filter, the output y rapidly increases to reach u. As the cycle proceeds, the input u falls below the output y. The exponentiating block 1102, whose input u−y is now negative, reduces its output $u_f$ to a very small value, close to zero, which in turn causes the outputy of the low-pass filter 1104 to drop exponentially at a rate determined by its time constant. Since the low-pass filter's time constant is much longer than the input period, y does not drop appreciably in one cycleof the input u. Therefore, in steady state, the output y stays very close to the peak value of the input u, with a small drop between successive input peaks. If the input amplitude drops appreciably, the error u−y is constantly negative and the input $u_f$ of the low-pass filter is therefore essentially zero. The output y falls exponentially until it reaches the new, reduced, peak value of the input u. On the other hand, an increase in the input amplitude causes the input us of the low pass filter to be very large due to the exponentiation of a positive quantity, and y therefore rises rapidly to reach the new peak value. This "fast attack" behavior is desirable, since, in a dynamically biased filter, the bias is preferably kept larger than the input in order to avoid distortion.

Figure 12:
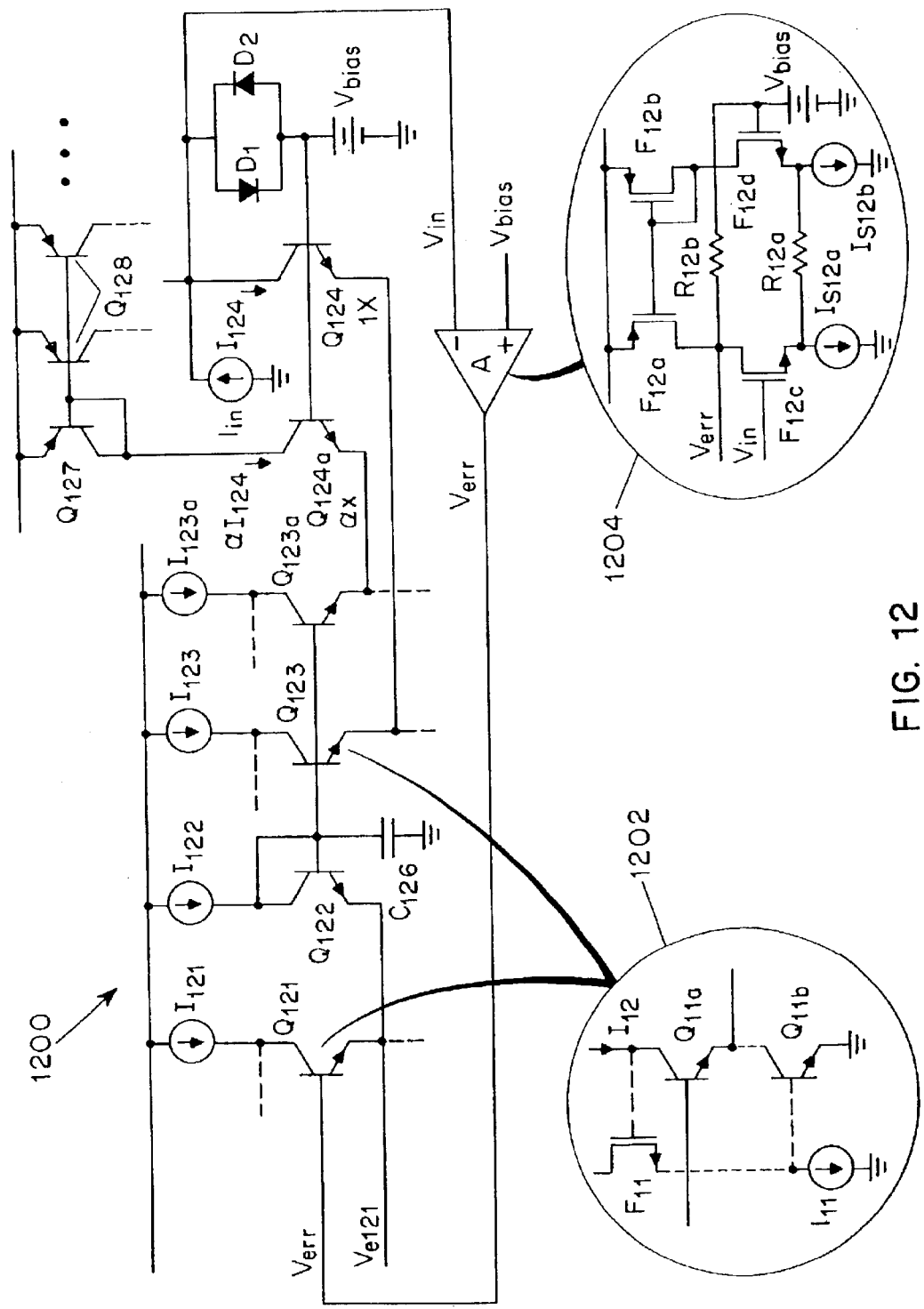
FIG. 12 is a schematic diagram illustrating a current-mode envelope detector in accordance with the invention.

FIG. 12 illustrates an example of a circuit realization, in accordance with the invention, of the envelope detector of FIG. 11. In the detector 1200 of FIG. 12, the input signal and the output envelope are current-mode signals. However, voltage-mode signals can also be received and generated by, e.g., adding simple current-voltage converters. For example, a transconductor such as the circuit of FIG. 1 can be used to convert a voltage-mode signal to a current-mode signal.

The emitter voltage $V_{e121}$ of transistor $Q_{121}$ in FIG. 12 can be written as:

$$V_{e121}=V_{err}-V_t \ln(I_{121}/I_s),$$

where $I_s$ is the saturation current of $Q_{121}$.

The circuit comprising transistors $Q_{121}$, $Q_{122}$, $Q_{123}$, and $Q_{124}$, the capacitor $C_{126}$, and the bias sources $I_{121}$, $I_{122}$, and $I_{123}$ acts as a low-pass filter governed by the following equation:

$$\frac{dI_{124}}{dt}=-\frac{I_{122}}{C_{126}V_t}I_{124}+\frac{I_{123}}{C_{126}V_t}I_{121}\exp\left(\frac{V_{bias}-V_{err}}{V_t}\right).$$

The last term in the above equation denotes the input to the low-pass filter. $V_{err}$ appears in the argument of the exponential. This circuit can therefore perform the combined functions of the exponentiator 1102 and low-pass filter 1104 of FIG. 11 if $V_{err}$ is made proportional to the error between the input and the output.

The output $I_{124}$ is subtracted from the input $I_{in}$ at the collector node of $Q_{124}$. If $I_{in}$ is larger than $I_{124}$, the collector voltage of $Q_{124}$ increases, and if $I_{in}$ is smaller than $I_{124}$, the collector voltage of $Q_{124}$ decreases. The voltage swing at the collector of $Q_{124}$ is limited by a voltage-limiter. In the particular circuit of FIG. 12, the voltage-limiting function is performed by diodes $D_1$ and $D_2$. The error voltage thus generated at the collector is inverted by the amplifier A—in order to obtain the correct sign for feedback—and fed to the base of $Q_{121}$ as $V_{err}$.

In order to tap the output, the bases of $Q_{123a}$ and $Q_{124a}$ are connected to the bases of $Q_{123}$ and $Q_{124}$, respectively. Transistor $Q_{124a}$ is fabricated with a cross-sectional area a times larger than $Q_{124}$ in order to ensure a safety margin in the bias current fed to the log-domain filters. The term "cross-sectional area," as used herein, can include the collector area and/or the emitter area of a transistor, depending on the particular device-fabrication technology used to form the transistors. PNP transistors $Q_{127}$ and $Q_{128}$ are used to mirror $\alpha I_{124}$ as required, thereby providing dynamically controlled bias currents for one or more nodes of a main circuit for which dynamic biasing is desired. An exemplary embodiment of the inverting amplifier A is illustrated in inset 1204 of FIG. 12. The amplifier A includes p-channel FETs $F_{12a}$ and $F_{12b}$, which form a current mirror, as well as amplifying n-channel FETs $F_{12c}$ and $F_{12d}$. The sources of $F_{12c}$ and $F_{12d}$ are connected by a resistor $R_{12a}$. The drain of $F_{12c}$ is connected to the bias voltage $V_{bias}$ of the envelope detector through a resistor $R_{12b}$ which serves as an output load for the amplifier. FETs $F_{12c}$ and $F_{12d}$ are biased by bias currents $I_{S12a}$ and $I_{S12b}$, respectively.

When the amplifier A is used as part of the envelope detector of FIG. 12, the collector voltage $V_{in}$ of transistor $Q_{124}$ is fed into the gate of n-channel FET $F_{12c}$. Because the amplifier A operates in a differential mode, its output $V_{err}$ is proportional to the difference between $V_{bias}$ and $V_{in}$.

Figure 23:
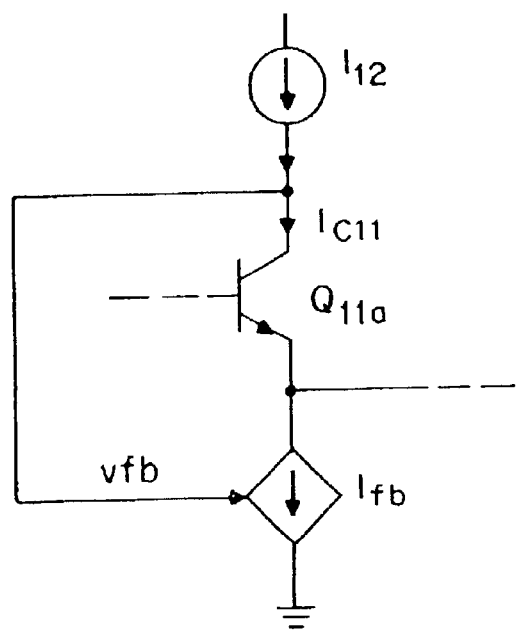
FIG. 23 is a schematic diagram illustrating a feedback arrangement in accordance with the invention.

FIG. 12 also illustrates an exemplary embodiment of a feedback arrangement 1202 which can be used to drive bias currents $I_{121}$ and $I_{123}$ through $Q_{121}$ and $Q_{123}$ in a controlled manner. The transistor in $Q_{11a}$ in the feedback arrangement 1202 represents a transistor through which a regulated current is to be driven—e.g., one of the transistors $Q_{122}$, $Q_{123}$, or $Q_{124}$ in FIG. 12. The operation of the feedback arrangement 1202 can be readily understood by considering FIG. 23, in which the n-channel FET $F_{11}$, the NPN transistor $Q_{11b}$, and current source $I_{11}$, are modeled as a voltage-controlled current source $I_{fb}$. If the control voltage vfb increases, the current through $I_{fb}$ increases. If the collector current $I_{c11}$ of the transistor $Q_{11a}$ tends to be smaller than the current $I_{12}$, the collector voltage of $Q_{11a}$, which is also the control voltage vfb, tends to increase. This increased vfb increases the current through $I_{fb}$, which in turn draws a larger current through $Q_{11a}$. The opposite effect—i.e., a decrease in vfb and the current through $I_{fb}$—occurs when the collector current $I_{c11}$ tends to be larger than $I_{12}$. The circuit settles at a point where $I_{c11}=I_{12}$.

$F_{11}$, $I_{11}$, and $Q_{11b}$ emulate $I_{fb}$. $F_{11}$ and $I_{11}$ form a source follower with near-unity gain that simply translates the collector voltage to a suitable level for driving $Q_{11b}$. The level-shifted voltage is converted into a current using the transistor $Q_{11b}$. The circuit settles to a point where $I_{C11}=I_{12}$.

Figure 13:
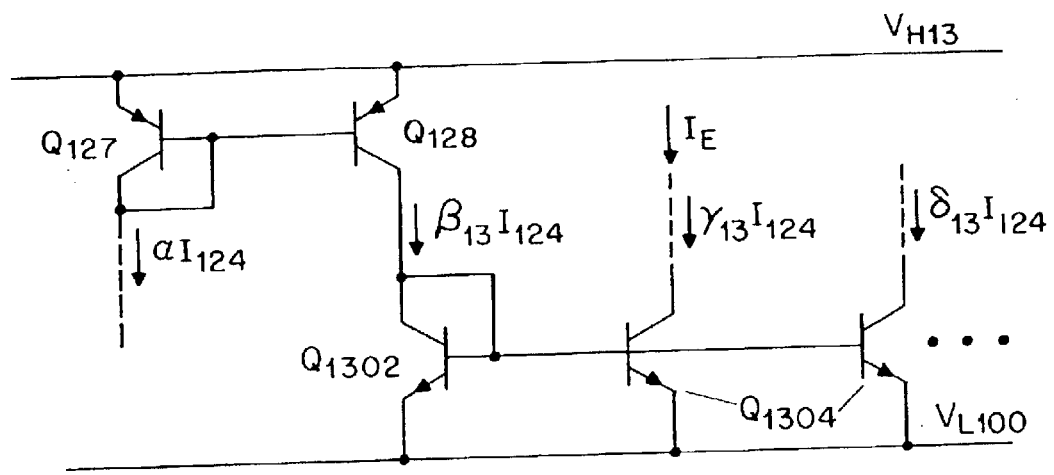
FIG. 13 is a schematic diagram illustrating a current mirror circuit in accordance with the invention.

FIG. 13 illustrates an example of an inverting current mirror which can be used to connect a dynamic bias control circuit (e.g., an envelope detector) to a signal-processing circuit (e.g., an amplifier, a transconductor, or a filter) which requires bias current to flow out of, not into, the signal processing circuit. For example, the current mirror of FIG. 13 can be used to connect the envelope detector of FIG. 12 to the transconductor circuit of FIG. 1.

The current mirror of FIG. 13 is powered by voltage sources $V_{H13}$ and $V_{L100}$. Transistor $Q_{127}$ (also illustrated in FIG. 12) is driven by output current $\alpha I_{124}$ of the envelope detector of FIG. 12. The base of PNP transistor $Q_{128}$ (also illustrated in FIG. 12) is connected to the base of PNP transistor $Q_{127}$, and accordingly, the current $\beta_{13}I_{124}$ flowing through $Q_{128}$ (where $\beta_{13}$ is a constant) is proportional to the current $\alpha I_{124}$ flowing through $Q_{127}$. The current $\beta_{13}I_{124}$ from $Q_{128}$ flows into the collector of a diode-connected (i.e., base and collector of transistor connected together) NPN transistor $Q_{1302}$. The base and collector of $Q_{1302}$ are connected to the respective bases of output transistors $Q_{1304}$. The output currents $\gamma_{13}I_{124}$ and $\delta_{13}I_{124}$ of the output transistors $Q_{1304}$ mirror the current $\beta_{13}I_{124}$ flowing through $Q_{1302}$, which in turn mirrors the current $\alpha I_{124}$ flowing through $Q_{127}$—$\alpha I_{124}$ being the output of the envelope detector of FIG. 12. It can therefore be seen that the output currents $\gamma_{13}I_{124}$ and $\delta_{13}I_{24}$ of the current mirror of FIG. 13 ultimately mirror the output current $\alpha I_{124}$ of the envelope detector of FIG. 12. Furthermore, output currents $\gamma_{13}I_{124}$ and $\delta_{13}I_{124}$ flow in the proper direction—i.e., with the current flowing in, not out—to provide the bias current $I_E$ to a circuit such as the transconductor of FIG. 1. The constants $\gamma_{13}$ and $\delta_{13}$ depend upon the device characteristics—e.g., the relative cross-sectional areas—of transistors $Q_{124}$, $Q_{124a}$, $Q_{127}$, $Q_{128}$, $Q_{1302}$, and $Q_{1304}$.

In order to utilize the envelope detector of FIG. 12 to control the bias of a differential circuit such as the transconductor of FIG. 1, it can be desirable to feed only the positive side, or only the negative side, of differential voltage signal $V_i$ into the non-differential input current signal $I_{in}$ of the envelope detector. For example, one side of the voltage-mode signal $V_i$ can be fed into the input of the detector through a resistor, in order to produce the current-mode signal $I_{in}$. Alternatively, $V_i$ can be converted to a current-mode signal using a transconductor. For example, the conversion can be performed using a non-dynamically biased version of a circuit having a topology similar to the transconductor of FIG. 1, but in which $I_E$ is kept constant, rather than being adjusted as described above. Such a circuit can be particularly useful, because it can convert a differential, voltage-mode signal into a non-differential, current-mode signal. The aforementioned non-dynamically biased circuit—which can send a signal into the input $I_{in}$ of the envelope detector of FIG. 12—is not to be confused with the dynamically biased version of the circuit of FIG. 1, in which the bias current $I_E$ can be adjusted by an output current—e.g., $\gamma_{13}I_{124}$ or $\gamma_{13}I_{124}$—of a current mirror receiving the output current $\alpha I_{124}$ of the envelope detector of FIG. 12.

The envelope detector of FIG. 12 can also be utilized to control the bias of a filter such as the low-pass filters of FIGS. 8a and 8b. For example, the input signal $i_{in}$ of the filter of FIG. 8a —or a signal proportional to $i_{in}$—can be used as the input signal $I_{in}$ of the envelope detector of FIG. 12. The collector current of one of the output transistors $Q_{128}$ (illustrated in FIGS. 12 and 13) can then be used as the bias input $I_{bias}$ of the filter of FIG. 8a. A matching collector current approximately equal to $I_{bias}$ and produced by, e.g., a different one of the output transistors $Q_{128}$ can similarly be used to bias an auxiliary circuit such as the circuit of FIG. 8b.

An envelope detector such as the one illustrated in FIG. 12 can also be used, in conjunction with a current mirror, to provide a bias current $(I_{2p}/I_{3p})I_{bias}$ into the output transistor $Q_{4p}$ of the filter of FIG. 8a. In addition, the envelope detector and current mirror can be used to provide a bias current $(I_{2n}/I_{3n})I_{bias}$ into the output transistor $Q_{4n}$ of the filter of FIG. 8b.

Figure 16:
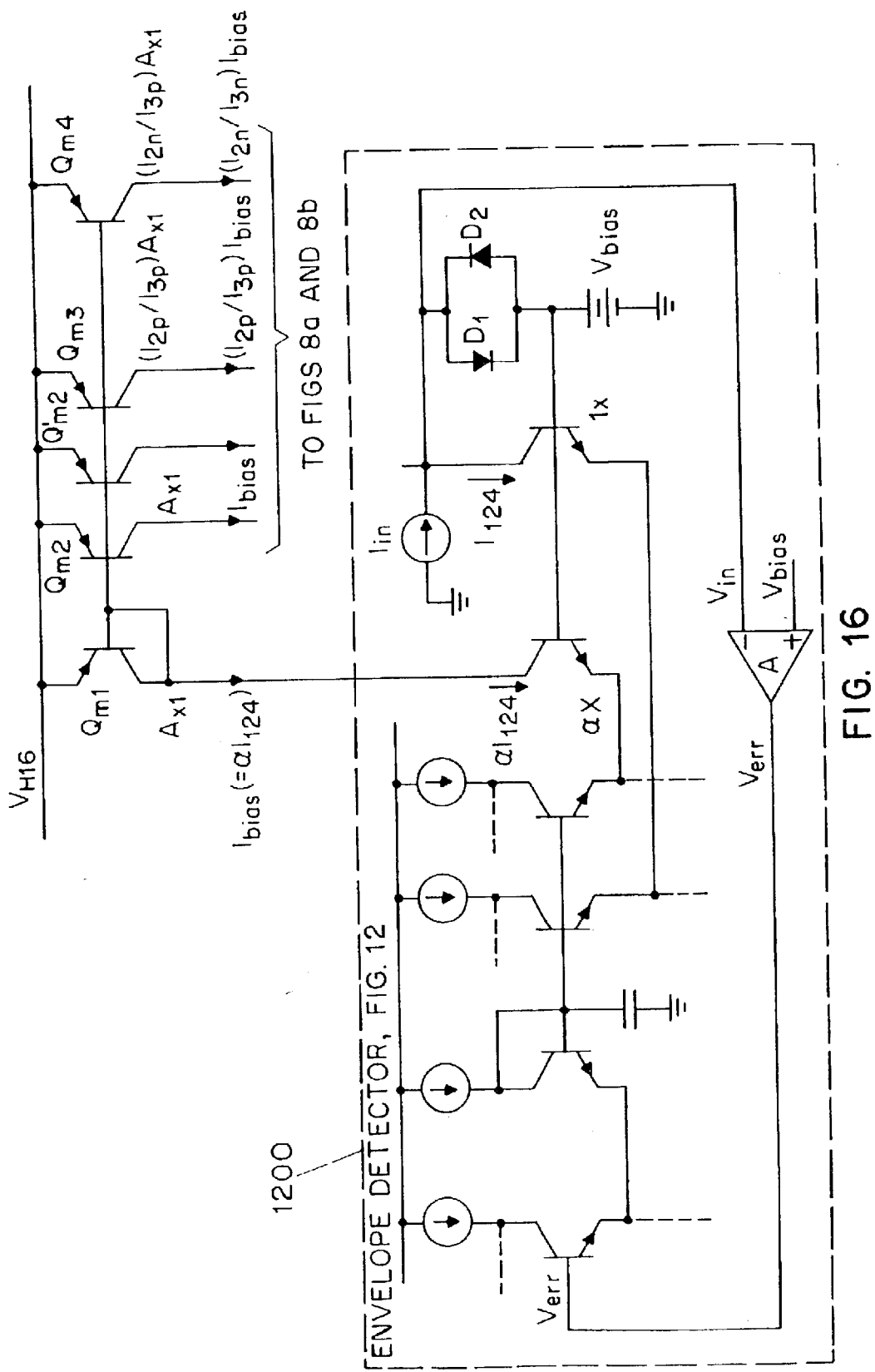
FIG. 16 is a schematic diagram illustrating a circuit including the envelope detector of FIG. 12 coupled to a current mirror circuit in accordance with the invention.

An example of such a configuration is illustrated in FIG. 16, in which the envelope detector 1200 of FIG. 12 pulls current from a diode-connected PNP transistor $Q_{m1}$, the base and collector of which are connected to the respective bases of current-mirror transistors $Q_{m2}$ and $Q_{m3}$. The emitters of $Q_{m1}$, $Q_{m2}$, and $Q_{m3}$ are connected to a voltage source $V_{H16}$.

Transistor $Q_{m1}$ has a cross-sectional area $A_{x1}$. Transistor $Q_{m2}$ has an approximately equal cross-sectional area, and therefore produces approximately the same current, $I_{bias}=\alpha I_{124}$, as is pulled through $Q_{m1}$. However, transistor $Q_{m3}$ is designed to have a cross-sectional area $(I_{2p}/I_{3p})A_{x1}$. Therefore, because the collector current of a bipolar transistor is generally proportional to the area of the transistor, $Q_{m3}$ produces a current $(I_{2p}/I_{3p})I_{bias}$ which can be used to bias transistor $Q_{4p}$ of the filter of FIG. 8a. In a preferred embodiment, an additional transistor $Q_{m4}$ having an area $(I_{2n}/I_{3n})A_{x1}$ can be included in the current mirror of FIG. 16. The resulting current, $(I_{2n}/I_{3n})I_{bias}$, can be used to bias transistor $Q_{4n}$ of the filter of FIG. 8b. Moreover, it is desirable to provide yet another transistor $Q_{m2}'$ having an area of approximately $A_{x1}$, in order to provide bias current for $Q_{1n}$ of the filter of FIG. 8b.

Figure 20A:
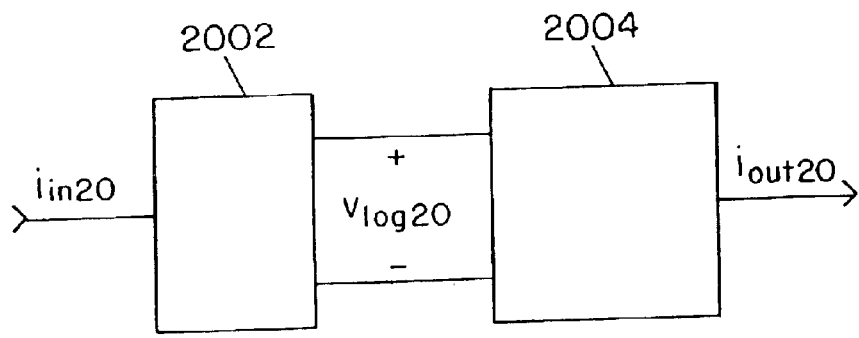
FIG. 20a is a block diagram illustrating a log-domain filter.
Figure 20B:
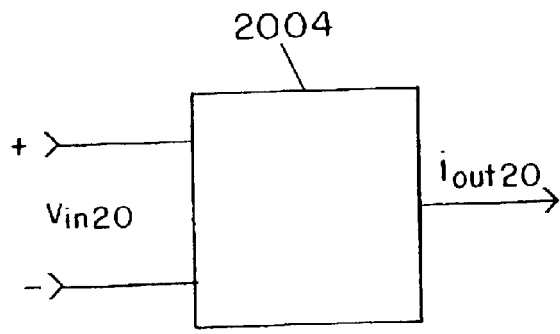
FIG. 20b is a block diagram illustrating a log-domain filter with an input stage omitted.

In accordance with an additional embodiment of the invention, the input (i.e., compressing) stage of a companding filter can be eliminated, leaving only the frequency-dependent components and the expanding stage. An example of such a technique is illustrated by FIGS. 20a and 20b. FIG. 20a is a block diagram of an exemplary log-domain circuit having an input circuit 2002 and an output circuit 2004. The input circuit receives an input current $i_{in20}$ and performs a logarithmic operation on the input current $i_{in20}$, thus generating a logarithmically compressed voltage $V_{log20}$. The output circuit 2004 filters and exponentiates the compressed voltage $V_{log20}$, thus generating an output current $i_{out20}$.

In accordance with the invention, the input circuit 2002 can be eliminated, leaving only the output circuit 2004, as illustrated in FIG. 20b. The output circuit 2004 acts as a combination of an exponentiator and a low-pass filter. An input voltage $V_{in20}$ can be applied directly to the input of the circuit 2004 which then generates a filtered, exponentiated output current $i_{out20}$ based upon the input voltage $V_{in20}$. Such a circuit can be useful for applications requiring an exponential filter. For example, the filter-exponentiator 2004 of FIG. 20 can, optionally, be used to replace the filter 1104 and the exponentiator 1102 of the circuit of FIG. 11.

It has been demonstrated by the foregoing discussion that the design of syllabic companding log-domain filters can be greatly simplified by eliminating the compensation circuit in accordance with the invention. As discussed in detail above, the approach of the invention has numerous advantages over conventional methods involving syllabic companding and instantaneous companding log-domain filters.

Although the present invention has been described in connection with specific exemplary embodiments, it should be understood that various changes, substitutions and alterations can be made to the disclosed embodiments without departing from the spiit and scope of the invention as set forth in the appended claims.

We claim:

1. An apparatus for processing a signal, comprising:
   a selected one of a class-AB circuit and a class-B circuit, the selected one having at least one input and at least one bias, the at least one input being adapted to receive at least one input signal, and the selected one being configured to process the at least one input signal to thereby generate at least one output signal related to the at least one input signal by an input-output characteristic having a crossover region which introduces distortion; and an amplitude detector configured to perform the operations of:
   receiving the at least one input signal,
   detecting at least one amplitude of the at least one input signal, and
   dynamically adjusting the at least one bias in accordance with the at least one amplitude, wherein the at least one bias controls a level of the at least one output signal such that the at least one output signal avoids the crossover region.

2. An apparatus as recited in claim 1, wherein the selected one comprises an amplifier.

3. An apparatus as recited in claim 1, wherein the selected one comprises a filter.

4. An apparatus as recited in claim 3, wherein the filter is internally non-linear.

5. An apparatus as recited in claim 3, wherein the filter comprises a companding filter.

6. An apparatus as recited in claim 3, wherein the filter comprises a log-domain filter.

7. An apparatus as recited in claim 1, wherein the amplitude detector comprises a filtered rectifier.

8. An apparatus as recited in claim 1, wherein the amplitude detector comprises a filter-exponentiator configured to low-pass-filter and exponentiate a detected signal comprising the at least one input signal, thereby generating a filtered-exponentiated signal, wherein an output signal of the amplitude detector comprises the filtered-exponentiated signal, and wherein the detected signal comprises the output signal of the amplitude detector.

9. A method of processing a signal, comprising:
   receiving at least one input signal into a selected one of a class-AB circuit and a class-B circuit, the selected one having at least one bias;
   processing, by the selected one, the at least one input signal to thereby generate at least one output signal related to the at least one input signal by an input-output characteristic having a crossover region which introduces distortion;
   receiving, into an amplitude detector, the at least one input signal;
   detecting, by the amplitude detector, at least one amplitude of the at least one input signal; and
   dynamically adjusting, by the amplitude detector, the at least one bias in accordance with the at least one amplitude, wherein the at least one bias controls a level of the at least one output signal such that the at least one output signal avoids the crossover region.

10. A method as recited in claim 9, wherein the selected one comprises an amplifier.

11. A method as recited in claim 9, wherein the selected one comprises a filter.

12. A method as recited in claim 11, wherein the filter is internally non-linear.

13. A method as recited in claim 11, wherein the filter comprises a companding filter.

14. A method as recited in claim 11, wherein the filter comprises a log-domain filter.

15. A method as recited in claim 9, wherein the amplitude detector comprises a filtered rectifier.

16. A method as recited in claim 9, further comprising:
   low-pass-filtering and exponentiating a detected signal comprising the at least one input signal, thereby generating a filtered-exponentiated signal; and
   generating a detector output signal comprising the filtered-exponentiated signal, wherein the detected signal comprises the detector output signal.

* * * * *

UNITED STATES PATENT AND TRADEMARK OFFICE
CERTIFICATE OF CORRECTION

PATENT NO. : 6,861,896 B2  Page 1 of 1
APPLICATION NO. : 10/353200
DATED : March 1, 2005
INVENTOR(S) : Tsividis et al.

It is certified that error appears in the above-identified patent and that said Letters Patent is hereby corrected as shown below:

IN THE SPECIFICATION:
On Page 1, Column 1, line 9, please insert the following header and paragraph:

-- Statement Regarding Federally Sponsored Research or Development
This invention was made with government support under grant number CCR9902781 awarded by the National Science Foundation. The government has certain rights in the invention. --

Signed and Sealed this

Twenty-fourth Day of June, 2008

JON W. DUDAS
*Director of the United States Patent and Trademark Office*